(12) United States Patent
Goto

(10) Patent No.: US 8,823,838 B2
(45) Date of Patent: Sep. 2, 2014

(54) IMAGE PICKUP SYSTEM WITH AUTO FOCUS MODE

(75) Inventor: Hisashi Goto, Tokyo (JP)

(73) Assignee: Olympus Corporation, Tokyo (JP)

( * ) Notice: Subject to any disclaimer, the term of this patent is extended or adjusted under 35 U.S.C. 154(b) by 574 days.

(21) Appl. No.: 13/163,472

(22) Filed: Jun. 17, 2011

(65) Prior Publication Data

US 2011/0317042 A1 Dec. 29, 2011

(30) Foreign Application Priority Data

Jun. 28, 2010 (JP) .................................. 2010-145818

(51) Int. Cl.
| | |
|---|---|
| H04N 5/217 | (2011.01) |
| H04N 5/369 | (2011.01) |
| G03B 13/36 | (2006.01) |
| H04N 5/357 | (2011.01) |
| G03B 3/10 | (2006.01) |
| G02B 7/34 | (2006.01) |
| H04N 5/232 | (2006.01) |

(52) U.S. Cl.
CPC .............. *G02B 7/346* (2013.01); *H04N 5/3696* (2013.01); *G03B 13/36* (2013.01); *H04N 5/3572* (2013.01); *G03B 3/10* (2013.01); *H04N 5/23212* (2013.01)
USPC ............ 348/241; 348/245; 348/251; 348/345

(58) Field of Classification Search
CPC .............................. H04N 5/3696; H04N 5/361
USPC .................................. 348/245, 251, 241, 345
See application file for complete search history.

(56) References Cited

U.S. PATENT DOCUMENTS

| | | | |
|---|---|---|---|
| 4,912,493 A * | 3/1990 | Tanaka ............................. 396/93 |
| 8,350,954 B2 * | 1/2013 | Hamano ......................... 348/349 |
| 2011/0164169 A1 * | 7/2011 | Yamasaki ...................... 348/345 |
| 2012/0002085 A1 * | 1/2012 | Sekine ........................... 348/241 |
| 2013/0057734 A1 * | 3/2013 | Tachi ............................. 348/242 |

FOREIGN PATENT DOCUMENTS

| | | | |
|---|---|---|---|
| JP | 2000-156823 | 6/2000 | |
| JP | 2004-264343 | 9/2004 | |
| JP | 2008-040087 | 2/2008 | |
| WO | WO 2010050386 A1 * | 5/2010 | ............... G02B 7/34 |

* cited by examiner

*Primary Examiner* — Roberto Velez
*Assistant Examiner* — Cynthia Segura
(74) *Attorney, Agent, or Firm* — Kenyon & Kenyon LLP

(57) ABSTRACT

An image pickup system includes an image pickup apparatus in which, photoelectric conversion cells are arranged two-dimensionally, and at least some of the photoelectric conversion cells are arranged to output a signal for detecting an amount of defocus. The photoelectric conversion cells which output the signal for detecting the amount defocus form at least two photoelectric conversion cell groups, each receiving a light beam from a pupil area having different area. Each photoelectric conversion cell group has a plurality of photoelectric conversion cell columns. The image pickup system includes a calculating section which has an AF mode which generates a defocus signal by comparing mutually the signals for detecting the amount of defocus which have been output from the two photoelectric conversion cell groups, and a correction section which corrects the signal for detecting the amount of defocus, from information related to distortion of the taking lens.

6 Claims, 22 Drawing Sheets

|     | F01 | F02 | F03 | F04 | F05 | F06 | F07 | F08 | F09 | F10 | F11 | F12 | F13 | F14 | F15 | F16 |
|-----|-----|-----|-----|-----|-----|-----|-----|-----|-----|-----|-----|-----|-----|-----|-----|-----|
| L01 | G | R | G | R | G | R | G | R | G | R | G | R | G | R | G | R |
| L02 | B | G | B | G | B | G | B | G | B | G | B | G | B | G | B | G |
| L03 | G | R | G | R | G | R | G | R | G | R | G | R | G | R | G | R |
| L04 | B | G | B | G | B | G | B | G | B | G | B | G | B | G | B | G |
| L05 | G | R | G | R | G | R | G | R | G | R | G | R | G | R | G | R |
| L06 | B | G | B | G | B | G | B | G | B | G | B | G | B | G | B | G |
| L07 | G | R | G | R | G | R | G | R | G | R | G | R | G | R | G | R |
| L08 | B | G | B | G | B | G | B | G | B | G | B | G | B | G | B | G |
| L09 | G | R | G | R | G | R | G | R | G | R | G | R | G | R | G | R |
| L10 | B | G | B | G | B | G | B | G | B | G | B | G | B | G | B | G |
| L11 | G | R | G | R | G | R | G | R | G | R | G | R | G | R | G | R |
| L12 | B | G | B | G | B | G | B | G | B | G | B | G | B | G | B | G |
| L13 | G | R | G | R | G | R | G | R | G | R | G | R | G | R | G | R |
| L14 | B | G | B | G | B | G | B | G | B | G | B | G | B | G | B | G |
| L15 | G | R | G | R | G | R | G | R | G | R | G | R | G | R | G | R |
| L16 | B | G | B | G | B | G | B | G | B | G | B | G | B | G | B | G |

IMAGE PICKUP SYSTEM WITH AUTO FOCUS MODE

CROSS-REFERENCE TO RELATED APPLICATION

The present application is based upon and claims the benefit of priority from the prior Japanese Patent Application No. 2010-145818 filed on Jun. 28, 2010; the entire contents of which are incorporated herein by reference.

BACKGROUND OF THE INVENTION

1. Field of the Invention

The present invention relates to an image pickup system.

2. Description of the Related Art

In a conventional digital still camera, an AF (auto focus) type such as the following has been realized.

In other words, a sensor for AF has been provided separately apart from an image pickup element. A typical example is a phase-difference AF which is used in a single-lens reflex camera. A merit of this type is that a problem of parallax is solved by using a light beam which has passed through a taking lens, and it is possible to detect a focal shift by a one-time defocus amount detection signal, and to focus the taking lens to an object, and it is possible to shorten time till focusing.

However, in the abovementioned type, it is necessary to dispose an optical path switching unit or an optical path dividing unit between the taking lens and the image pickup element, and furthermore, an optical system for AF is necessary between the sensor for AF and the optical path switching unit or the optical path dividing unit. This demerit leads to an increase in size from a point of (1) securing space for the optical path switching unit, and a point of (2) securing space for a separate sensor and the optical system for AF. Furthermore, (3) in a case of disposing the optical path switching unit, there is a time lag due to switching with a switching mechanism, and (4) in a case of disposing the optical path dividing unit, there is a loss of amount of light due to division of optical path.

Also, there is an AF type which uses an output of an image pickup element. A typical example is a contrast AF which has been used in a so-called compact digital camera or a video camera. In this type, the image pickup element and the AF sensor being integrated, there is a merit of space and a merit of lesser number of structural members.

However, in the contrast AF, there are demerits that it is necessary to compare contrast signals of plurality of times, and due to wobbling, it takes time till focusing. Furthermore, in video photography, blurring of image due to wobbling is also photographed, and an image quality is degraded. Larger the number of pixels, this tendency is more conspicuous.

Furthermore, in recent years, with respect to the single-lens reflex camera which includes an optical finder in which a quick-return mirror and a roof prism (Dachkantoprism) are used, an interchangeable lens camera which is premised on an electronic view finder which does not require the quick-return mirror and the roof prism, has been released, and a high image quality has been sought both in still photography and video photography. In this interchangeable lens camera, an AF which has the merits of both AF types mentioned above, and in which, the demerits of both the type are eliminated, has been sought. Moreover, even as an image pickup system in which, the taking lens is fixed to a camera body, a system with a short focusing time has been sought.

SUMMARY OF THE INVENTION

In view of the abovementioned issues and requirements, in a solid image pickup apparatus disclosed in Japanese Patent Application Laid-open Publication No. 2000-156823, some of pixels of an image pickup element are formed to output a signal for ranging, and each of these pixels for ranging has a micro lens which has been disposed on a photoelectric conversion portion, and a light shielding film layer having a specific opening portion which has been disposed between the micro lens and the photoelectric conversion portion. The photoelectric conversion portion form a first pixel in which, the opening of the light shielding film layer is inclined with respect to an optical center of the micro lens, and a second pixel in which, the opening of the light shielding film layer is inclined with respect to the optical center of the micro lens, toward a direction opposite to a first photoelectric conversion cell, and focusing is carried out by using phase-difference information of output signals of these two types of pixels. Around these pixels for ranging, a plurality of pixels which output a signal for forming an image signal is disposed to surround, and image formation is carried out by interpolating image information of a position of the pixel for ranging by pixel information for image formation of surrounding pixels.

In a proposal made in Japanese Patent Application Laid-open Publication No. 2000-156823, a ranging principle of a phase-difference AF by division of a pupil which has been used in the conventional single-lens reflex camera, has been adopted.

Moreover, in an image pickup apparatus disclosed in Japanese Patent Application Laid-open Publication No. 2008-40087, disposing a plurality of photoelectric conversion portions to make it possible to receive separately each light beam having a pupil divided as a structure of a pixel for ranging, has been proposed. According to this structure, by adding outputs from the plurality of photoelectric conversion portions formed in one pixel for ranging at the time of image formation, it is possible to reduce practically a difference of aperture efficiency with the pixel for image formation. On the other hand, since it is same as increasing the number of pixels of the image pickup element practically, the structure becomes difficult.

Incidentally, in the conventional single-lens reflex camera, since two images which are to be compared in a focus detecting optical system are formed from the same position of a primary image formation surface, it has been hard to have an effect of distortion of the taking lens. Moreover, since an optical finder which observes directly an image which is formed by the taking lens, even for eliminating an uncomfortable feeling due to direct observation, excluding a special lens such as a fish-eye lens, the distortion of the taking lens has been corrected quite favorably optically.

Consequently, in a phase-difference AF system of the conventional single-lens reflex camera, there has been no need to take into consideration the distortion of the taking lens. Here, a depth of the fish-eye lens being substantial, a high AF accuracy has been sought. Moreover, it is a camera with specifications in which, no off-axis AF in particular, including the fish-eye lens and other special lens, is carried out. There is also a camera in which, phase-difference information is achieved by correcting distortion of a phase-difference type AF optical system. However, the distortion of the phase-difference type AF optical system being invariable with respect to a focusing position and a focal length of the taking lens in a case of zooming, or the taking lens, it is possible to let to be a fixed value, and to incorporate in a correlation operation expression.

Moreover, in the so-called compact digital camera, as disclosed in Japanese Patent Application Laid-open Publication No. 2004-264343, improving parameters of image quality other than distortion, and small-sizing of a photographic optical system have been proposed instead of increasing the distortion of the photographic optical system. In this case, it is common to use the contrast AF, and a phase-difference AF system in which, a light beam which has passed through the taking lens, has not been applied.

In the contrast AF, since a contrast value and a sharpness of an image are evaluated, there is no effect of distortion. Moreover, when an evaluated value of the contrast AF is calculated for an image in which, the distortion has been corrected by image processing, the contrast and the sharpness etc. of the image are degraded due to correcting the distortion. Therefore, it is preferable not to correct the distortion by image processing. A distortion in a recorded image of a photographic optical system with a large distortion is to be corrected by image processing, and an image to be observed is to be recorded with a favorable distortion.

Moreover, it is desirable that a distortion in an image which is displayed on a display installed in a camera system is corrected by image processing. In other words, in a case of carrying out the contrast AF, it is desirable that the distortion has been corrected by image processing, and it is necessary to change image information by a process of display and recording, which complicates the process.

An image pickup system according to the present invention includes an image pickup apparatus in which, photoelectric conversion cells which convert an optical image which has been formed by a taking lens to an electric signal, are arranged two-dimensionally, and at least some of the photoelectric conversion cells are arranged to output a signal for detecting an amount of defocus, and the photoelectric conversion cells which output the signal for detecting the amount of defocus form at least two photoelectric conversion cell groups, each receiving a light beam from a pupil area having a different area, and each photoelectric conversion cell group has a plurality of photoelectric conversion cell columns, and the image pickup system includes calculating section which has an AF mode which generates a defocus signal by comparing mutually the signals for detecting the amount of defocus, which have been output from the two photoelectric conversion cell groups, and a correction section which corrects the signal for detecting the amount of defocus, from information related to distortion of the taking lens.

BRIEF DESCRIPTION OF THE DRAWINGS

FIG. 18 is a plan view showing conceptually an arrangement of color filters upon associating with FIG. 17;

DETAILED DESCRIPTION OF THE INVENTION

Figure 1:
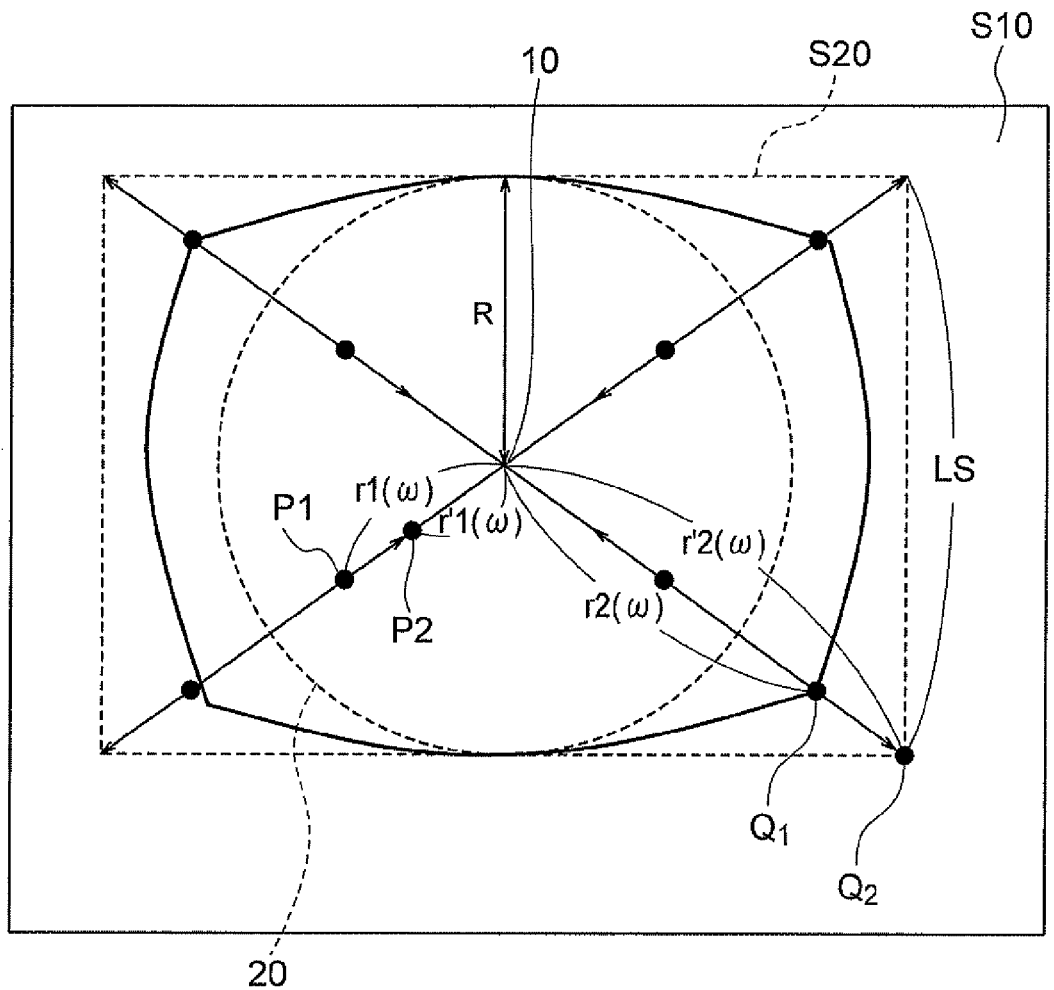
FIG. 1 is a plan view for explaining a digital correction on an image pickup surface.

An embodiment and modified embodiments of an image pickup system according to the present invention will be described below in detail by referring to the accompanying diagrams. However, the present invention is not restricted to the embodiment and the modified embodiments described below.

Firstly, an action and an effect by the image pickup system according to the present invention will be described below.

The image pickup system according to the present invention includes an image pickup apparatus in which, photoelectric conversion cells which convert an optical image which has been formed by a taking lens, to an electric signal, are arranged two-dimensionally, and at least some of the photoelectric conversion cells are arranged to output a signal for detecting an amount of defocus, and the photoelectric conversion cells which output the signal for detecting the amount of defocus form at least two photoelectric conversion cell groups, each receiving a light beam from a pupil area having a different area, and each photoelectric conversion cell group has a plurality of photoelectric conversion cell columns, and the image pickup system includes a calculating section which has an AF mode which generates a defocus signal by comparing the signals for detecting the amount of defocus, which have been output from the two photoelectric conversion cell groups, and a correction section which corrects the signal for detecting the amount of defocus, from information related to distortion of the taking lens.

According to the abovementioned structure, in the AF mode which generates the defocus signal by comparing signal information from the two photoelectric cell groups, an accuracy of comparison of the information of two images is improved by taking into account the information of distortion, and an improvement in accuracy of the AF is facilitated. At this time, by constituting each photoelectric conversion cell group by the plurality of photoelectric conversion cell columns, it becomes easy to secure a quality of the signal information after the correction.

In the image pickup system according to the present invention, it is preferable that the correction section corrects signal information of one photoelectric conversion cell column of the photoelectric conversion cell group, and lets to be one set of signal information, and corrects signal information of the photoelectric conversion cell column of another photoelectric conversion cell group, and lets to be another set of signal information, and calculates phase-difference information from these two sets of signal information.

The distortion also being a phenomenon of forming a curvilinear image of an object which is rectilinear, when the abovementioned structure is adopted, by using the signal information of the plurality of photoelectric conversion cell columns, it is possible to carry out effectively, the correction of the image of the rectilinear object which has become curvilinear.

Moreover, in the image pickup system according to the present invention, it is preferable that the correction section corrects a signal for detecting a defocus signal by information for correcting distortion of a recorded image of the taking lens stored in a lens-information recording section.

By using distortion correction information of the image to be recorded jointly, it is possible to simplify the image pickup system. Moreover, the taking lens which has the distortion correction information of the recorded image can also correct phase-difference information.

In the image pickup system according to the present invention, it is preferable that a correction amount of a signal for detecting the defocus signal and a correction value of image data which is recorded have different modes.

It is desirable that a correction of the image data to be recorded is adjusted such that the image data is made to be observed naturally, and a correction of the signal information of the defocus signal is adjusted such that more accurate amount of defocus is calculated. Since it is not necessary that the two corrections match, it is desirable to let different correction modes.

In the image pickup system according to the present invention, it is preferable that the taking lens satisfies the following conditional expression (1).

$$0.05 \leq |(1 - Yim/(f \cdot \tan(\omega im)))| \leq 0.35 \quad (1)$$

where, f denotes a focal length of the taking lens,

Yim denotes an arbitrary image height in a range of 0.4 to 0.8 when a distance from a center in an effective image pickup surface of an electronic image pickup element up to the farthest point is let to be 1, and ωim denotes an angle with respect to an optical axis in an object-point direction corresponding to image points connecting from the center on the effective image pickup surface of the electronic image pickup element to a position of Yim.

When a lower limit value of conditional expression (1) is surpassed, demerits due to the correction are more than the effect of correction of the distortion, and therefore it is not preferable.

Moreover, when an upper limit value of conditional expression (1) is surpassed, signal degradation due to the correction of distortion becomes substantial, and therefore it is not preferable.

In the image pickup system according to the present invention, it is preferable that the taking lens is detachably attachable, and when information related to distortion of an image of the taking lens cannot be read in a predetermined format by the taking lens which has been installed, the correction of distortion is not to be carried out.

When the information related to distortion of the image of the taking lens cannot be read, the distortion of the taking lens is presumed to be small in many cases, and it is desirable not to carry out correction of distortion, rather than setting a fixed correction amount.

Next the distortion correction will be described below.

The image pickup system according to the present invention has an arrangement which makes an electronic image pickup element (image pickup apparatus) form an image having a distortion, intentionally, and which eliminates the distortion by image processing. Since a lens system of the image pickup system enables to make high an acceptable value of distortion which has been designed, it is possible to have full benefit of merits from points of size, weight, manufacturing ease, and cost. Particularly, by imparting a substantial barrel distortion, it is possible to select information of wide angle of field without enlarging the optical system. This will be described below concretely.

An image which has been distorted in a barrel shape becomes image data which has been subjected to photoelectric conversion via the electronic image pickup element. This image data is subjected to a modification process which is equivalent to a shape-change electrically (distortion of image). When such process has been carried out, when image data which has been output finally by the electronic image pickup element is reproduced by an apparatus such as a display apparatus, the distortion of the image is corrected digitally, and an image which almost resembles to a shape of the object is achieved.

Here, a basic concept for correcting digitally the distortion of image will be described. FIG. 1 is a plan view for explaining the digital correction on an image pickup surface.

For instance, as shown in FIG. 1, letting a point of intersection 10 of an optical axis of an image pickup element and an image pickup surface S10 to be a center, a magnification on a circumference (image height) of radius R which is inscribed on a short side of an effective image pickup surface S20 is fixed, and the circumference of radius R is let to be a basis for correction. Moreover, the correction is to be carried out by moving concentrically, each point on a circumference (image height) of an arbitrary radius r(ω) other than radius R almost in a direction of radiation, to become radius r'(ω).

For example, in FIG. 1, point P1 on a concentric circle of radius r1(ω), which is positioned at an inner side of a circle 20 of radius R having the point of intersection as a center, is moved toward a center point 10 of a circle 20, to a point P2 on a concentric circle of radius r'1(ω) after correction. Moreover, a point Q1 on a concentric circle of radius r2(ω), which is positioned at an outer side of the circle 20 of radius R is moved in a direction away from the center point 10 of the circle 20, to a point Q2 on a concentric circle of radius r'2(ω) after correction. These radii are related by a relation r'1(ω)<r1(ω)<R<r2 (ω)<r'2(ω), and r'1(ω), r1(ω), r2ω), and r'2(ω) take arbitrary values while satisfying this relationship.

Here, r'(ω) can be expressed by the following expression (2).

$$r'(\omega)=\alpha \cdot f \tan \omega \quad (2)$$

Here, when $$0 \leq \alpha \leq 1,$$

ω is let to be a half angle of field of an object,
f is let to be a focal length an image forming optical system, and
an ideal image height corresponding to the circle 20 of radius R is let to be Y, then $$\alpha = R/Y = R/(f \tan \omega) \quad (3)$$

The optical system is rotationally symmetric with respect to an optical axis ideally, and in this case, the distortion also occurs rotationally symmetrically with respect to the optical axis. Consequently, as it has been described above, in a case of correcting electrically, the distortion which has occurred optically, firstly, the magnification on the circumference (image height) of the circle 20 of radius R which is inscribed on a long side of the effective image pickup surface S20 having the point of intersection 10 of image pickup surface S10 and the optical axis on the reproduction image, is to be fixed. Next, when the correction can be carried out by moving concentrically, each point on the circumference (image height) of the arbitrary radius r(ω) other than radius R almost in the direction of radiation, to become radius r'(ω), it is considered to be advantageous from points of amount of data and amount of computing.

However, an optical image, at a point of time when picked up by an electronic image pickup element, ceases to be a continuous amount due to sampling. Consequently, in a precise sense, the circle of radius R which is drawn on the optical image also ceases to be an accurate circle as long as pixels on the electronic image pickup element are not arranged in rows in a radial pattern. In other words, in a shape-correction of image data which is expressed for each discrete coordinate, there is no circle for which the magnification can be fixed.

Therefore, for each pixel (Xi, Yj), a method for determining coordinates (Xi', Yj') of a destination of movement is to be used. When two points (Xi, Yj) or more have moved to coordinates (Xi', Yj'), an average value of values of pixels is to be taken. Moreover, when there is no point which moves in, interpolation may be carried out by using values of coordinates (Xi', Yj') of some of the pixels in the surrounding area. This method is effective for correction in a case in which, the distortion with respect to the optical axis is conspicuous due to a factor such as a manufacturing error of the optical system or the electronic image pickup element in particular, and the circle 20 of radius R to be drawn on the optical image has become asymmetric. Moreover, this method is effective for correction in a case in which, a distortion such as a geometrical distortion occurs at the time of reproducing a signal in an image pickup element or various types of output units in an image.

For example, for calculating a correction amount 'r'(ω)−r(ω)', r(ω), or in other words, a relationship between a half angle of field and an image height, or a relationship between an actual image height r and an ideal height r'/α is recorded in a recording medium which is built-in in an electronic image pickup apparatus.

Moreover, in a zoom lens, a focal length segment which necessitates correction may be divided into a number of focal zones. Generally, when a focal length changes from a telephoto end to a wide angle end, there is an increase in a barrel distortion. Moreover, correction may be carried out by a correction amount same as in a case in which, a correction result which almost satisfies the following expression (4) near the telephoto end in the focal zone is achieved.

$$r'(\omega)=\alpha \cdot f \tan \omega \quad (4)$$

However, in that case, an amount of barrel distortion to some degree remains at the wide angle end in the focal zone. Moreover, when the number of focal zones is increased, there arises a need to hold specific data which is necessary for correction, in the recording medium additionally, and therefore it is not much preferable. Therefore, one or a number of coefficients related to each focal length in the focal zone is to be calculated in advance. It is preferable to determine these coefficients based on a measurement by simulation or a real instrument. The correction amount in the case in which, the correction result which almost satisfies the above-mentioned expression (4) near the telephoto end in the focal zone may be calculated, and the coefficients may be applied uniformly for each focal length, to the correction amount, and may be let to be the final correction amount.

Incidentally, when there is no distortion in the image which is achieved by imaging an object at infinity, the following expression (5) holds true.

$$f=y/\tan \omega \quad (5)$$

where,
y denotes a height (an image height) of an image point from the optical axis,
f denotes a focal length of an image forming system (zoom optical system), and
ω denotes an angle (half angle of field of object) with respect to the optical axis in a direction of object points corresponding to image points connecting from a center on the image pickup surface up to a position of y.

Whereas, when there is a barrel distortion in the image forming system, the following expression (6) holds true.

$$f>y/\tan \omega \quad (6)$$

In other words, when the focal length f of the image forming system and the image height y are let to be constant, the value of ω becomes high.

The following conditional expression (1) is an expression in which a degree of distortion of a taking lens system has been regulated.

$$0.05 \leq |(1-Yim/(f \tan(\omega im)))| \leq 0.35 \quad (1)$$

where, f denotes a focal length of the taking lens,

Yim denotes an arbitrary image height in a range of 0.4 to 0.8 when a distance (maximum image height) from a center in an effective image pickup surface (a surface on which the image can be picked up) of an electronic image pickup element up to the farthest point is let to be 1, and ωim denotes an angle with respect to an optical axis in an object-point direction corresponding to image points connecting from the center on the effective image pickup surface of the electronic image pickup element to a position of Yim.

Figure 2:
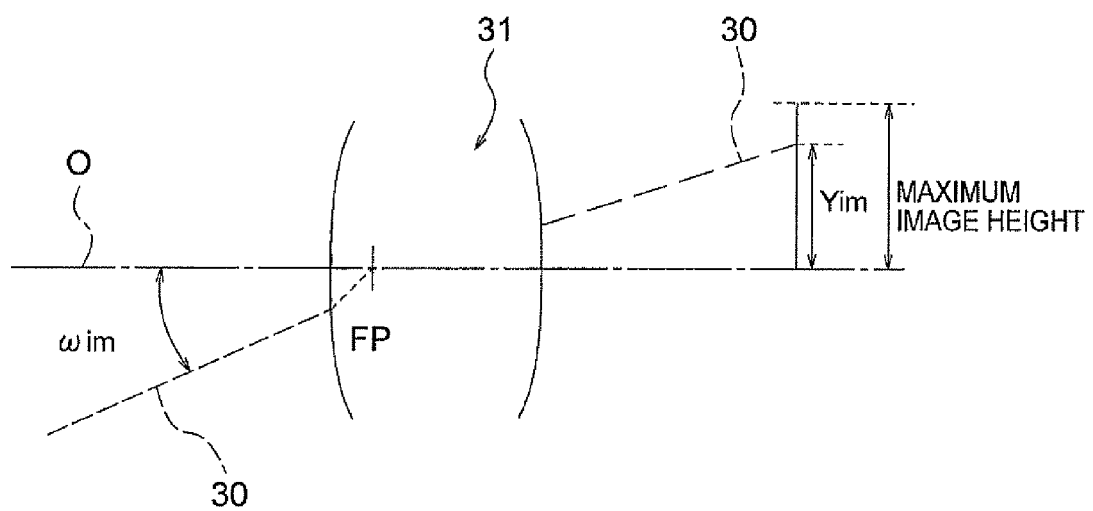
FIG. 2 is a diagram showing a relationship between an image height Yim and an angle ωim.

More elaborately, as shown in FIG. 2, ωim is an angle on an object side made by a chief light ray 30 which passes through a position of the image height Yim and an optical axis O, and is an angle which the chief light ray 30 which is directed from the object side toward a front-side principal point position FP of a zoom optical system 31 makes with the optical axis. FIG. 2 is a diagram showing a relationship between the image height Yim and the angle ωim.

In the correction of such distortion by image processing, information which is not a continuous amount due to sampling at the point of time when an image is picked up by the electronic image pickup element is to be corrected, there is a degradation of a signal other than distortion for prior to correction. Moreover, as the correction amount increases, processing of amount of elongation and compression of image increases substantially. Therefore, there is a degradation of signal other than distortion. In these processes, it is necessary to take into consideration an overall efficiency of calculating amount of defocus.

When a lower limit value of conditional expression (1) is surpassed, since demerits due to the correction are more than effect of correction of distortion, it is not preferable.

When an upper limit value of conditional expression (1) is surpassed, signal degradation due to correction of distortion increases, and it is not preferable.

Figure 3:
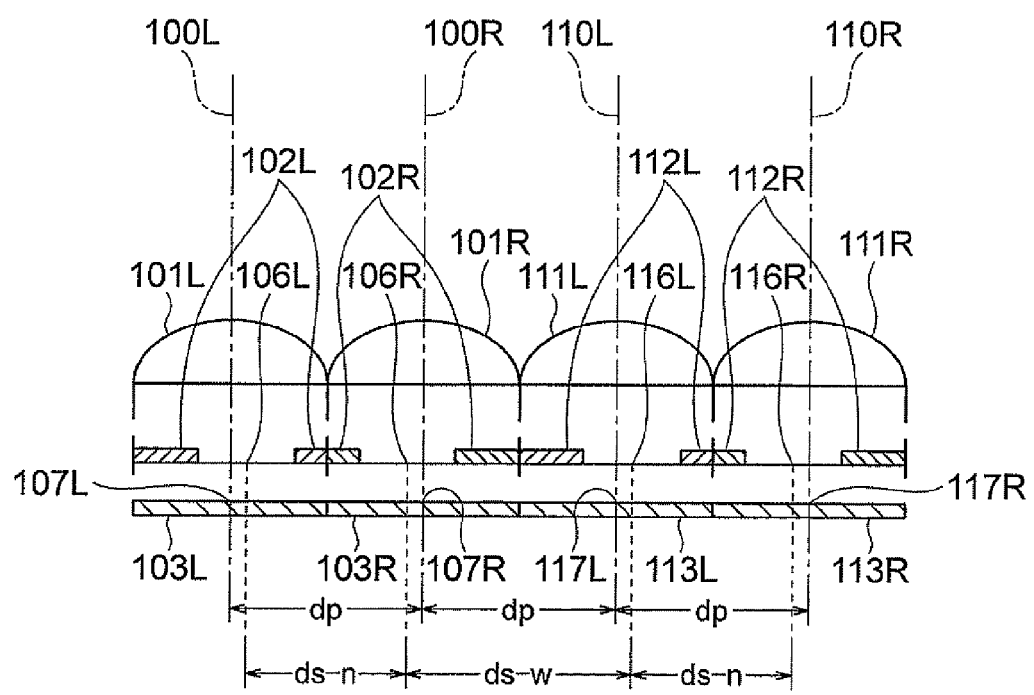
FIG. 3 is a cross-sectional view showing a schematic structure of pixels according to an embodiment of the present invention.
Figure 4:
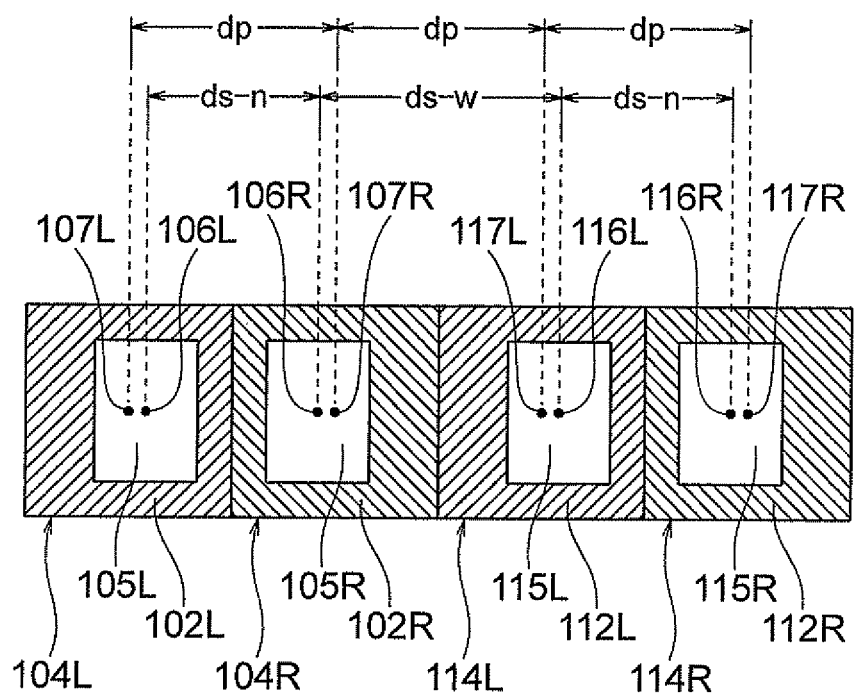
FIG. 4 is a plan view when the pixels shown in FIG. 3 are seen from a direction of an optical axis.

FIG. 3 is a cross-sectional view showing a schematic structure of pixels of the embodiment. FIG. 4 is a plan view when the pixels shown in FIG. 3 are seen from a direction of optical axes 100L, 100R, 110L, and 110R. In FIG. 4, micro lenses 101L, 101R, 111L, and 111R are omitted. Moreover, each of these pixels has a photoelectric conversion cell.

In FIG. 3 and FIG. 4, the pixels lined up side-by-side are shown, and an area of each photoelectric conversion area 105L, 105R, 115L, and 115R is same, but intervals of positions of centers of gravity of area (distance between centers of gravity of area) ds-n and ds-w, and an interval dp of pixel pitch are different.

Here, it is preferable that the area of each of the photoelectric conversion area 105L, 105R, 115L, and 115R is basically the same.

In FIG. 3 and FIG. 4, the micro lenses (sometimes also called as on-chip lenses) 101L, 101R, 111L, and 111R are disposed to correspond with pixels 104L, 104R, 114L, and 114R respectively of a sensor. A distance between the micro lenses 101L, 101R, 111L, and 111R depends on the pixel pitch, and taking into consideration an output pupil position of the taking lens, the micro lenses 101L, 101R, 111L, and 111R may be disposed at an interval smaller than the pixel pitch directed from a center toward periphery.

The photoelectric conversion cells of the pixels 104L, 104R, 114L, and 114R include photoelectric conversion surfaces 103L, 103R, 113L, and 113R respectively. In the respective pixels, a light shielding member 120L is disposed between the micro lens 101L and the photoelectric conversion surface 103L, a light shielding member 102R is disposed between the micro lens 101R and the photoelectric conversion surface 103R, a light shielding member 112L is disposed between the micro lens 111L and the photoelectric conversion surface 113L, and a light shielding member 112R is disposed between the micro lens 111R and the photoelectric conversion surface 113R. The light shielding members 102L, 102R, 112L, and 112R are disposed to be along four sides of the photoelectric conversion surfaces 103L, 103R, 113L, and 113R having a rectangular shape in a plan view. A planar shape of the light shielding members 102L, 102R, 112L, and 112R is a rectangular shape which is bilaterally asymmetric with respect to a pixel center.

In FIG. 3 which shows a schematic structure, the light shielding members 102L, 102R, 112L, and 112R are formed on the same plane. However, the light shielding members 102L, 102R, 112L, and 112R may not be formed on the same plane in the same pixel.

The photoelectric conversion areas 105L, 105R, 115L, and 115R of the respective pixels are determined by a relationship of the photoelectric conversion surfaces 103L, 103R, 113L, and 113R, the light shielding members 102L, 102R, 112L, and 112R, the micro lenses 101L, 101R, 111L, and 111R, and a taking lens that is to be assumed. The photoelectric conversion areas 105L, 105R, 115L, and 115R shown in FIG. 4 correspond to openings formed by the light shielding members 102L, 102R, 112L, and 112R on the photoelectric conversion surfaces 103L, 103R, 113L, and 113R.

The micro lenses 101L, 101R, 111L, and 111R are disposed such that optical axes 100L, 100R, 110L, and 110R thereof pass through pixels centers 107L, 107R, 117L, and 117R respectively, of the corresponding pixels.

The pixels 104L, 104R, 114L, and 114R, when seen from the optical axes 100L, 100R, 110L, and 110R, have the same rectangular shape, and the pixel pitch is same as a size of the pixel. The pixel centers 107L, 107R, 117L, and 117R of the pixels 104L, 104R, 114L, and 114R are points of intersection of diagonals of the rectangular planar shape (FIG. 4).

Moreover, centers of gravity 106L, 106R, 116L, and 116R of area of the photoelectric conversion areas 105L, 105R, 115L, and 115R having a rectangular shape in a plan view also are points of intersection of respective diagonals (FIG. 4).

By letting the planar shape of the light shielding members 102L, 102R, 112L, and 112R to be bilaterally asymmetric rectangular shape, the pixel centers 107L, 107R, 117L, and 117R of the pixels, and the centers of gravity 106L, 106R, 116L, and 116R of area of the photoelectric conversion areas are shifted in a left-right direction (left-right direction in FIG. 4). Consequently, the pixel pitch dp which is same as a distance between the pixel centers 107L, 107R, 117L, and 117R of the adjacent pixels and the distances ds-n and ds-w between the centers of gravity of area which are distances between the centers of gravity 106L, 106R, 116L, and 116R of area of the adjacent photoelectric conversion area are not same.

Here, the distance ds-n between the centers of gravity of area is a distance between centers of gravity of area when the centers of gravity of area of the adjacent photoelectric conversion areas are shifted in a left-right direction approaching mutually, and in examples in FIG. 3 and FIG. 4, is a distance between the center of gravity 106L of area of the pixel 104L and the center of gravity 106R of area of the pixel 104R, and a distance between the center of gravity 116L of area of the pixel 114L and the center of gravity 116R of area of the pixel 114R. Whereas, the distance ds-w is a distance between the centers of gravity of area when the centers of gravity of area of the adjacent photoelectric conversion areas are shifted in the left-right direction separating apart mutually, and in the examples in FIG. 3 and FIG. 4, is a distance between the center of gravity 106R of area of the pixel 104R and the center of gravity 116L of area of the pixel 114L.

Figure 5:
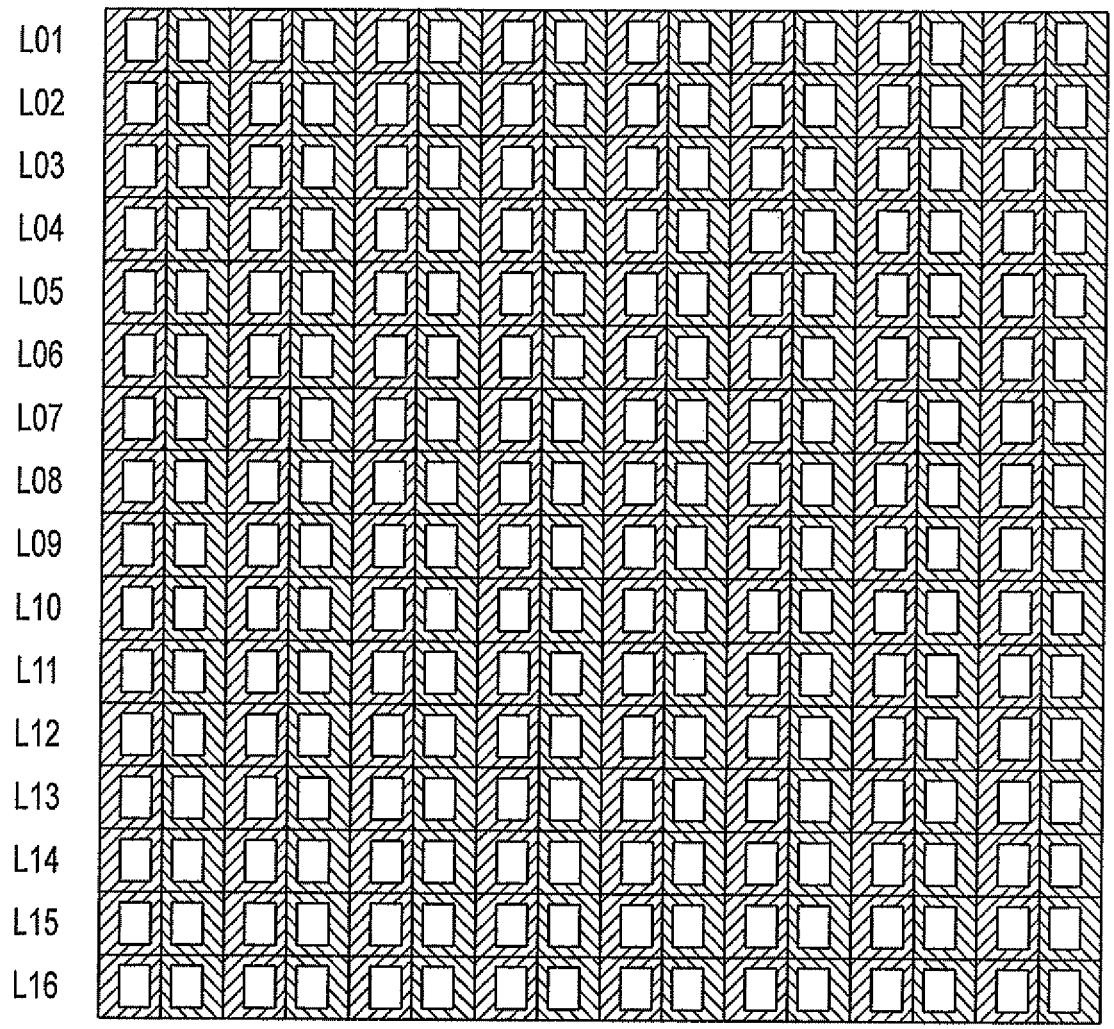
FIG. 5 is a plan view showing conceptually a pixel arrangement in an imager (electronic image pickup element) according to the embodiment of the present invention.
Figure 5:
Figure 5:

FIG. 5 is a plan view showing conceptually a pixel arrangement in an imager (electronic image pickup element) according to the embodiment. The imager shown in FIG. 5 is formed of pixels having same structure as two types of pixels shown in FIG. 3 and FIG. 4. FIG. 5 is a diagram in which, photoelectric conversion areas when seen from an optical axial directions of pixels, are shown. In this case, 16 vertical pixels and 16 horizontal pixels, in all 256 pixels are shown. However, the number of pixels is not restricted to 256, and it may be an arrangement in which the total number of pixels is more than 10 million. In this example, there are two types of pixels namely, pixels for which, the center of the photoelectric conversion area is shifted with respect to the center of the pixel in a direction toward right side, which are pixels 121, and pixels for which, the center of the photoelectric conversion area is shifted with respect to the center of the pixel in a direction toward left side, which are pixels 122. Here, the pixels will be called as right pixels 121 and left pixels 122. Moreover, when a specific pixel is to be shown, that pixel is to be expressed by assigning a row number from row numbers L01 to L16 and a column number from column numbers F01 to F16. For example, a pixel corresponding to column F01 in row L01 will be expressed as 'L01 FO1'.

Pixels shown in FIG. 5 are disposed in a repeated pattern in order of the right pixels 121 and the left pixels 122 from F01 to F16 in each of the rows from L01 to L16. When put in other words, the right pixels 121 are disposed in odd-numbered columns F01, F03, . . . , and the left pixels 122 are disposed in even-numbered columns F02, F04, . . . .

In this example, L05 F01 and L05 F02 have an arrangement in which, the distance between the centers of gravity is shorter than the distance between the pixels which is calculated from the pixel pitch. Moreover, L05 F02 and L05 F03 have an arrangement in which, the distance between the centers of gravity is wider than the distance between the pixels which is calculated from the pixel pitch.

A photoelectric conversion cell group formed by the left pixels 122 and another photoelectric conversion cell group formed by the right pixels 122 are to be assumed, and by calculating phase-difference information from output of each photoelectric conversion cell group, it is possible to adjust a defocus of the optical system. Here, the photoelectric conversion cell group formed by the right pixels 121 has a plurality of photoelectric conversion cell columns F01, F03, F05, . . . , and the photoelectric conversion cell group formed by the left pixels 122 has a plurality of photoelectric conversion cell columns F02, F04, F06, . . . .

Figure 6:
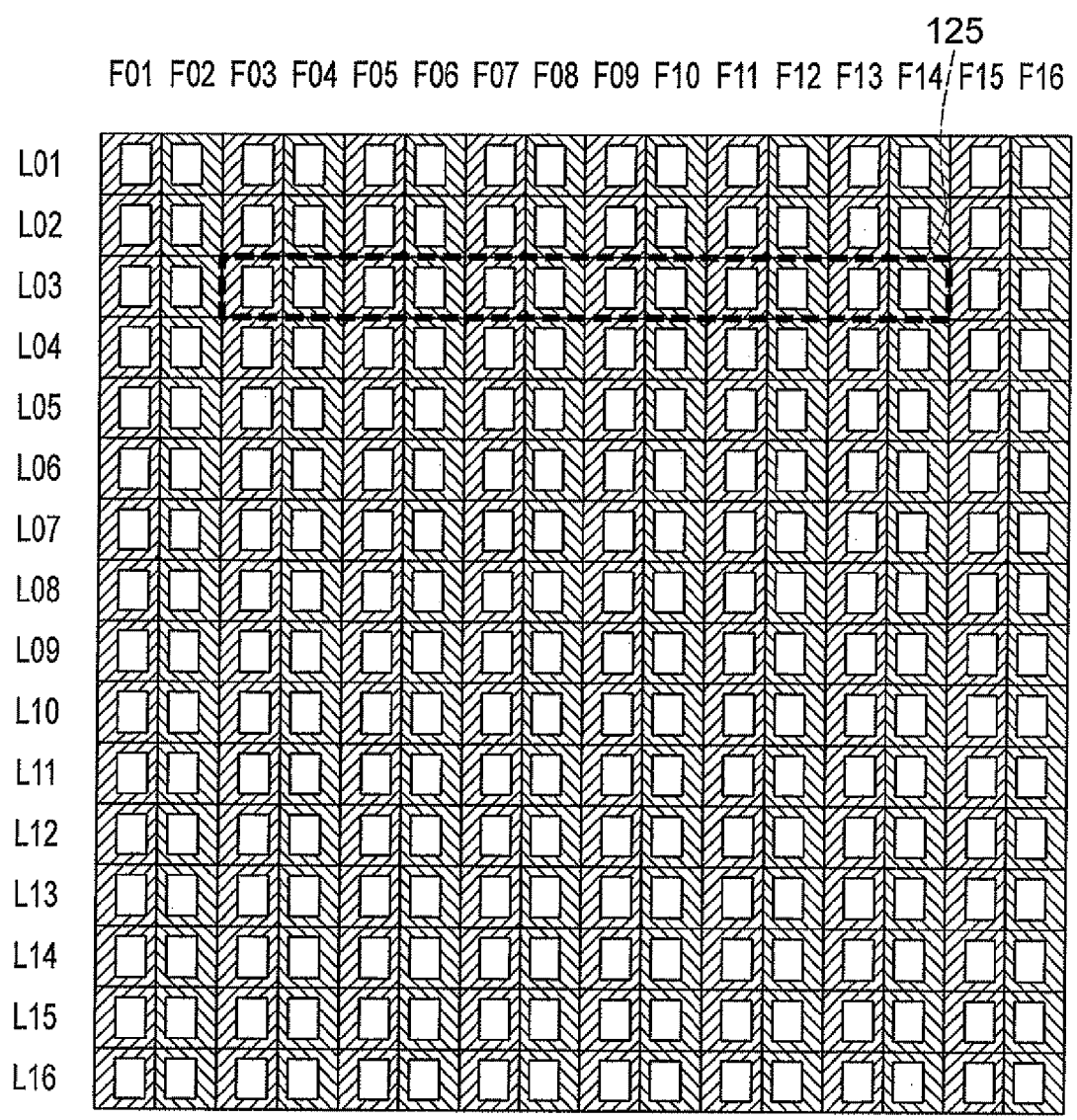
FIG. 6 is a plan view showing to be overlapped a pixel arrangement in an imager according to the embodiment of the present invention and information which is projected on the imager when no distortion occurs.
Figure 6:
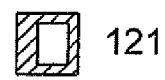
Figure 6:

In this case, in a case of a taking lens with a small distortion, a distortion which occurs in an optical system for AF which has been used in the conventional single-lens reflex camera does not occur. Therefore, information lined up on a straight line on the object side, as shown in an area 125 in FIG. 6, is projected on the image pickup element as lined up on the straight line. Here, FIG. 6 is a plan view showing to be overlapped a pixel arrangement in the imager according to the embodiment, and information which is projected on the imager when no distortion occurs.

When information projected on the image pickup element is compared upon dividing into a waveform which is obtained from outputs achieved from F03, F05, F07, F09, F11, and F13 which are the right pixels 121 in row L03, and a waveform which is obtained from outputs achieved from F04, F06, F08, F10, F12, and F14 which are the left pixels 122, defocus information and focal point position information can be acquired from a so-called phase-difference detection expression. In other words, due to defocus, a right-side waveform (waveform obtained from the right pixels 121) and a left-side waveform (waveform obtained from the left pixels 122) move in mutually opposite directions.

Figure 7:
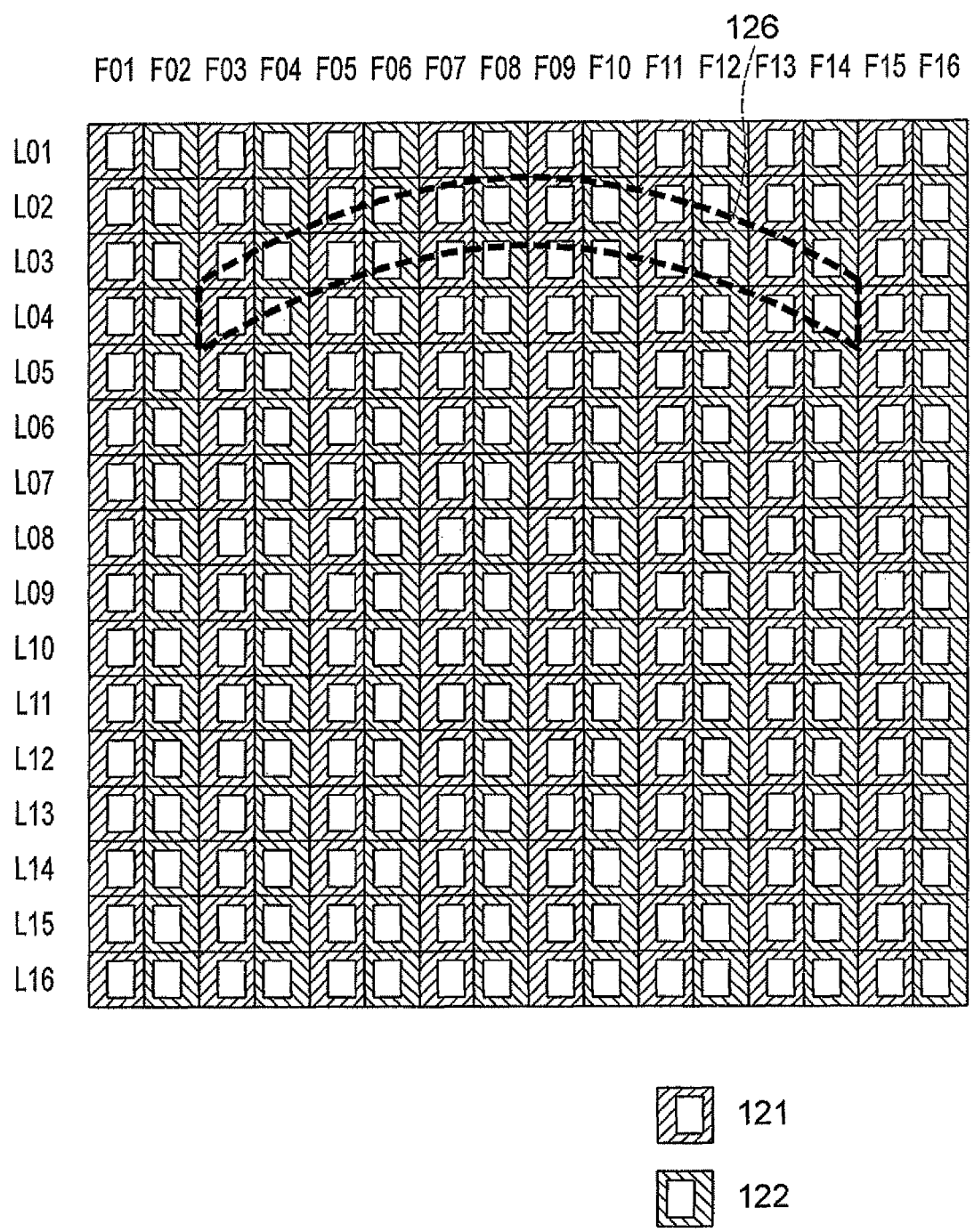
FIG. 7 is a plan view showing to be overlapped the pixel arrangement in the imager and information which is projected on the imager when the distortion is substantial.
Figure 7:
Figure 7:

Whereas, in a case of a taking lens with a substantial distortion, correction with high accuracy is possible by carrying out correction of distortion. FIG. 7 is a plan view showing to be overlapped the pixel arrangement in the imager and information which is projected on the imager when the distortion is substantial. For instance, information that a shape of an area 126 shown in FIG. 7 is on a straight line on the object side has become on a curved line, as a result of being projected on the image pickup element by the taking lens with a substantial distortion.

In a case in which the distortion shown in FIG. 7 is substantial, when AF is by contrast detection, detection of a focusing position is possible by evaluating contrast information of row L03 while changing focus of the taking lens. Moreover, a judgment of whether or not focused is possible by comparing the waveform obtained from the outputs which are achieved from F03, F05, F07, F09, F11, F13 which are the right pixels 121 in row L03 and the waveform obtained from the outputs which are achieved from F04, F06, F08, F10, F12, and F14 which are the left pixels 122.

On the other hand, at the time of calculating the amount of defocus, it is advantageous to use the phase-difference information as mentioned above. However, when the distortion is substantial as shown in FIG. 7, an accurate focus detection is possible by comparing a waveform of the right pixels 121 which are achieved from L04 F03, L03 F05, L02 F07, L02 F09, 'a combined output of L02 F11 and L03 F11', and L03 F13 and a waveform of the left pixels 122 which are achieved from L03 F04, 'a combined output of F02 F06 and L03 F06', L02 F08, L02 F10, L03 F12, and L04 F14.

Here, for the combined output, a ratio of outputs from the respective target pixels is determined according to a degree of a rectilinear deformation due to the deformation, or in other words, a curvilinear deformation of the area 126 shown in FIG. 7. For example, in a case of calculating a combined output of L02 F11 and L03 F11, when the area 126 lies on equal portions of L02 F11 and L03 F11, the combined output is an average value of an output signal of L02 F11 and an output signal of L03 F11.

Furthermore, by deforming the waveform obtained from the amount of deformation of the taking lens, it is possible to achieve a favorable accuracy of focal point detection.

Moreover, plurality of columns of focal point detection pixels being disposed in rows L02, L03, and L04, from a taking lens with no distortion to a taking lens with substantial distortion, can be corrected favorably.

An arrangement of the image pickup element is not restricted to an example of arrangement shown in FIG. 5. Arrangements such as arrangements shown in FIG. 8 and FIG. 9 for example are also applicable.

Figure 8:
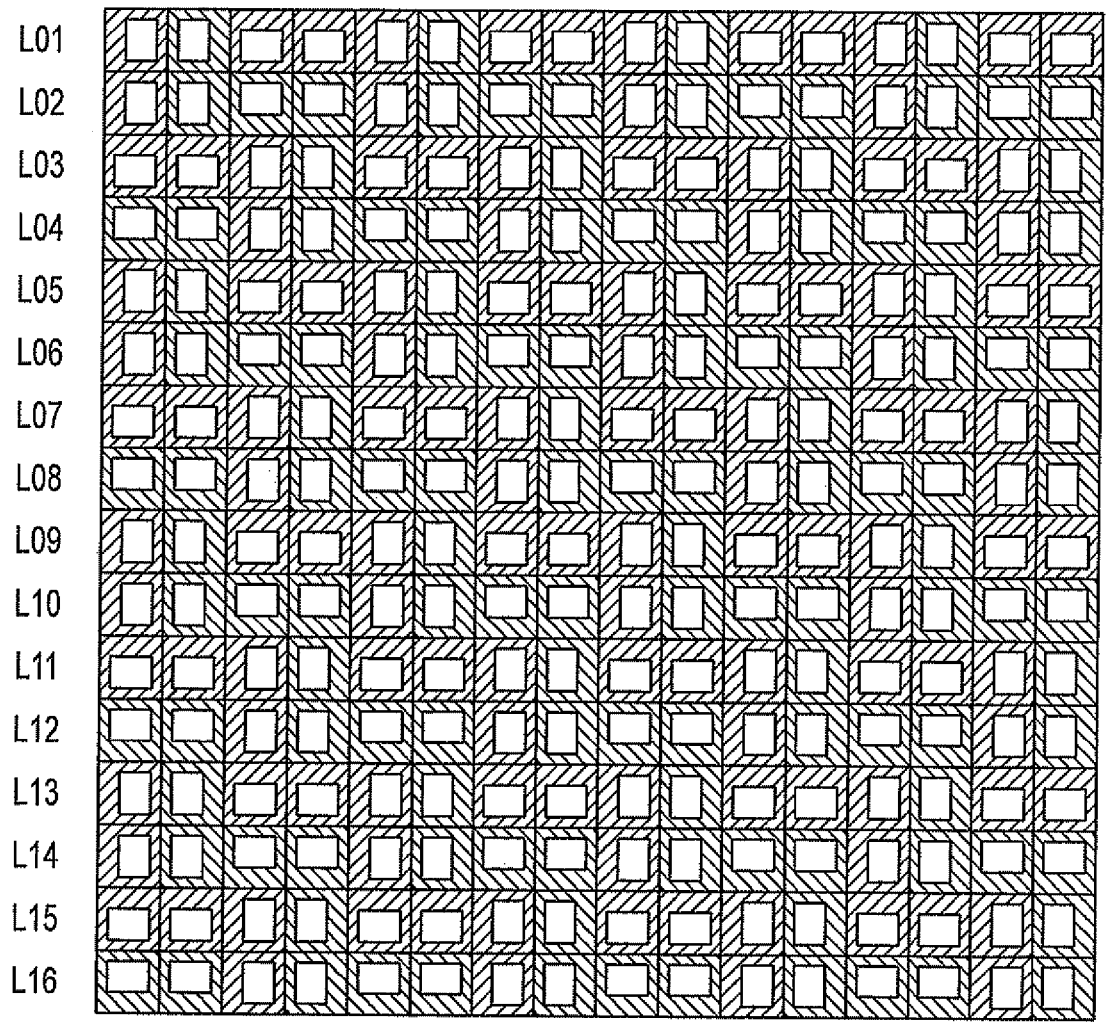
FIG. 8 is a plan view showing conceptually a pixel arrangement in an imager according to a first modified embodiment of the embodiment of the present invention.
Figure 8:
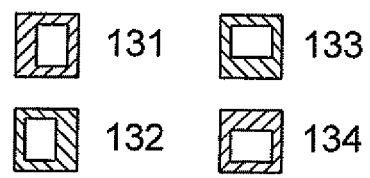
Figure 9:
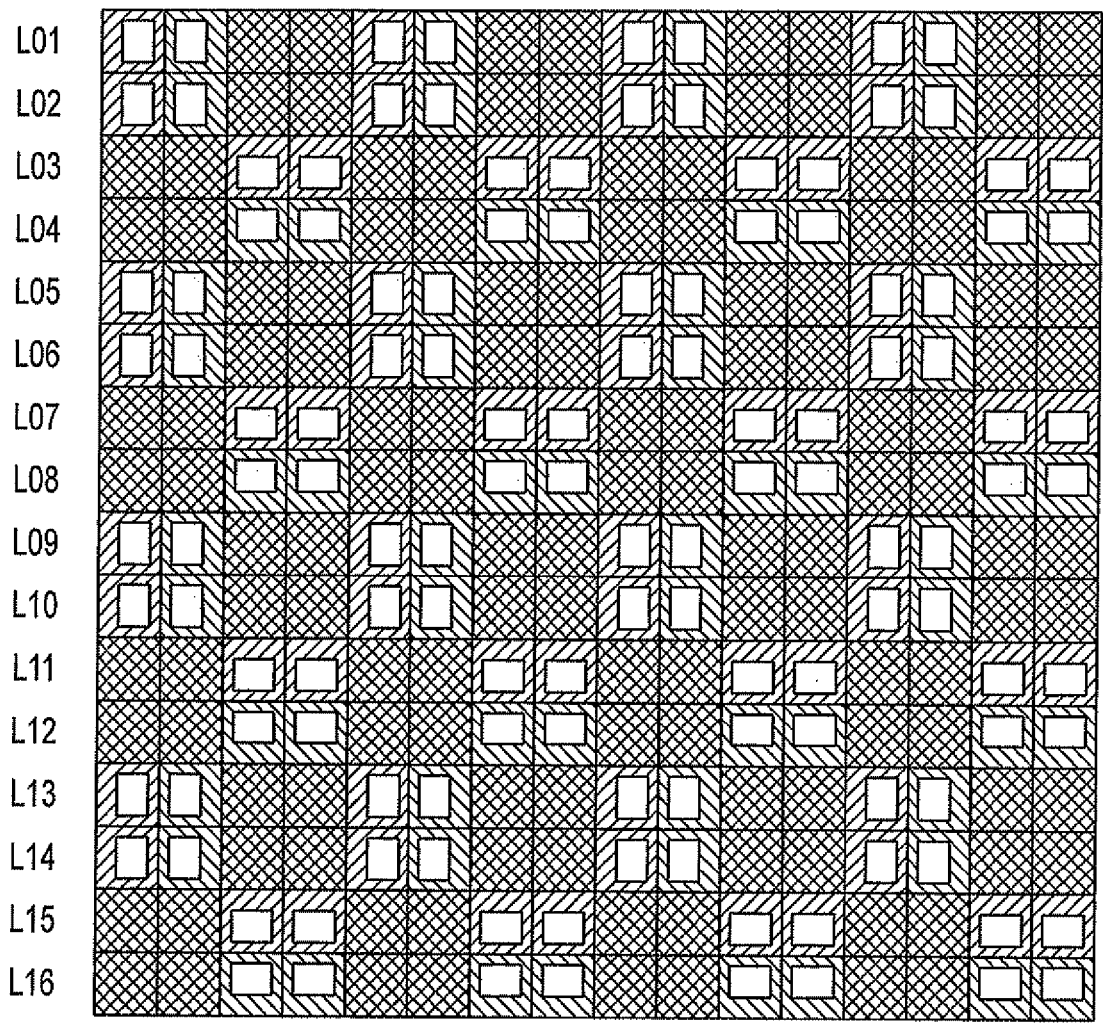
FIG. 9 is a plan view showing conceptually a pixel arrangement in an imager according to a second modified embodiment of the embodiment of the present invention.

FIG. 8 is a plan view showing conceptually a pixel arrangement in an imager according to a first modified embodiment of the embodiment of the present invention. FIG. 9 is a plan view showing conceptually a pixel arrangement in an imager according to a second modified embodiment of the embodiment of the present invention.

In the first modified embodiment, a direction of dividing a pupil, is let to be an upper side and a lower side in addition to a right side and a left side. In FIG. 8, an example of 16 vertical pixels (L01 to L16) and 16 horizontal pixels (F01 to F16), in all 256 pixels has been shown. However, the number of pixels is not restricted to 256, and it may be an arrangement in which, the total number of pixels is more than 10 million for example.

In the example shown in FIG. 8, the directions in which, the center of area of the photoelectric conversion cell is shifted with respect to the pixel center are four types namely, the right side, the left side, the upper side, and the lower side. In the following description, the pixels will be called as a right pixel 131, a left pixel 132, an upper pixel 133, and a lower pixel 134.

In FIG. 8, in row L01, the right pixel 131, the left pixel 132, the lower pixel 134, and the lower pixel 134 are disposed repeatedly in order from left side (from F01). In row L02, the right pixel 131, the left pixel 132, the upper pixel 133, and the upper pixel 133 are disposed repeatedly in order from left. In row L03, the lower pixel 134, the lower pixel 134, the right pixel 131, and the left pixel 132 are disposed repeatedly in order from left. In row L04, the upper pixel 133, the upper pixel 133, the right pixel 131, and the left pixel 132 are disposed repeatedly in order from left. Rows L05 onward are disposed such that a pattern of L01, L02, L03, and L04 is repeated.

Whereas, in the second modified embodiment shown in FIG. 9, pixels 141, 142, 143, and 144 which are to be used for focal point detection for a phase-difference AF and a pixel 150 which is not to be used for focus detection for the phase-difference AF are disposed. The pixels to be used for focal point detection for the phase-difference AF have centers of area of the photoelectric conversion area shifted with respect to pixel center shifted in four types of directions namely a right side, a left side an upper side, and a lower side, and the pixels are called as a right pixel 141, a left pixel 142, an upper pixel 143, and a lower pixel 144 respectively.

In FIG. 9, in rows L01 and L02, the right pixel 141, the left pixel 142, the pixel 150 which is not to be used for focal point detection, and the pixel 150 are disposed repeatedly in order from left (from F01). In row L03, the pixel 150, the pixel 150, the lower pixel 144, and the lower pixel 144 are disposed repeatedly in order from left. In row L04, the pixel 150, the pixel 150, the upper pixel 143, and the upper pixel 143 are disposed repeatedly in order from left. Rows L05 onward are disposed such that a pattern L01, L02, L03, and L04 is repeated.

In both the first modified embodiment and the second modified embodiment, a discrete degree of the pixels 150 for forming a waveform for the phase-difference AF increases. However, by increasing the total number of pixels of the image pickup element by 10 million for example, two images to be compared are formed from two different image points in a precise sense, but favorable focal point detection can be carried out by correcting by distortion information. It is preferable to carry out correction of a signal for detecting a defocus signal at a location where the image height is more than 0.5.

Figure 12:
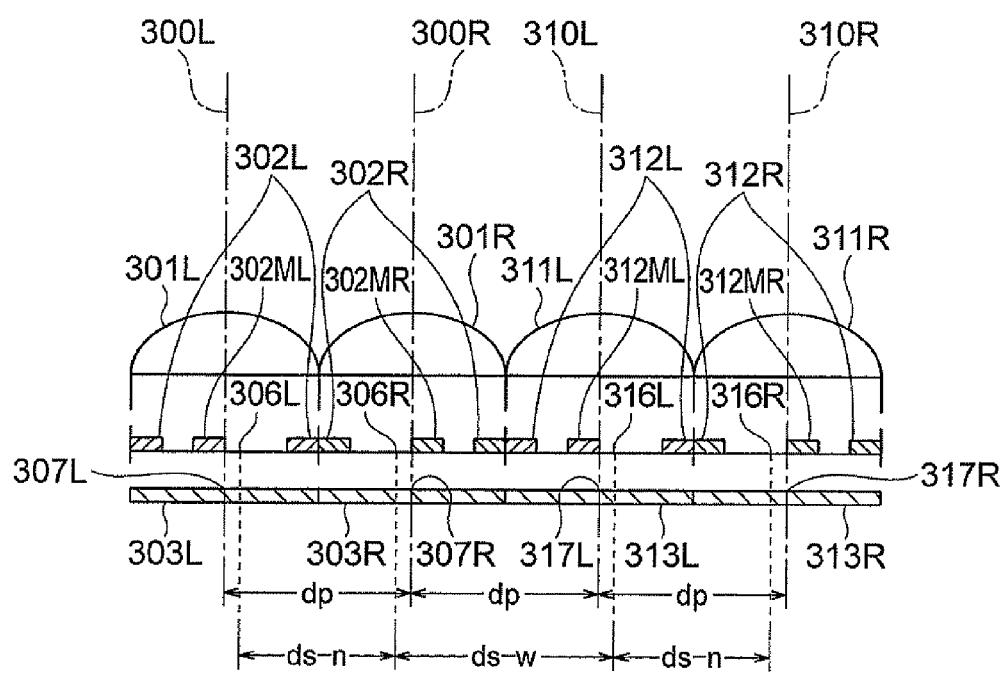
FIG. 12 is a cross-sectional view showing a schematic structure of pixels according to a fourth modified embodiment of the embodiment of the present invention.
Figure 13:
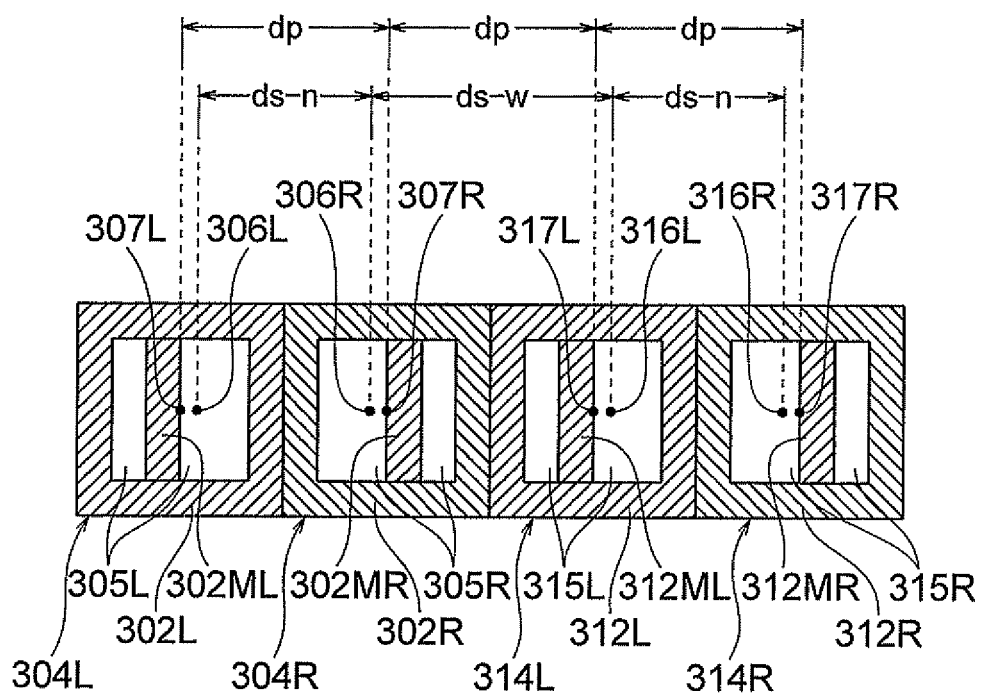
FIG. 13 is a plan view when the pixels shown in FIG. 12 are seen from a direction of optical axes 300L, 300R, 310L, and 310R.
Figure 14:
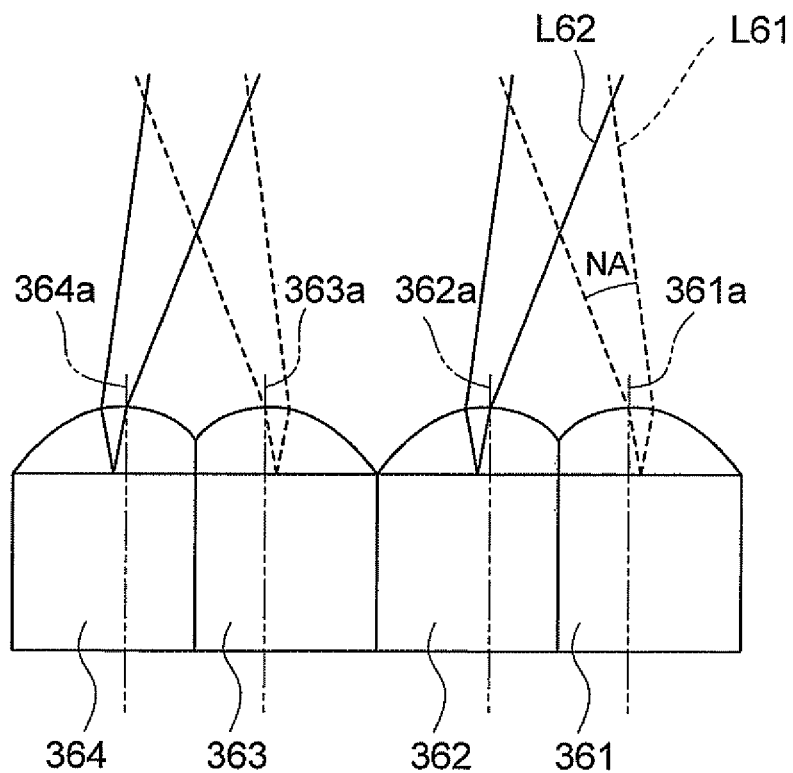
FIG. 14 is a cross-sectional view showing a schematic structure of pixels according to a fifth modified embodiment of the embodiment of the present invention.
Figure 15:
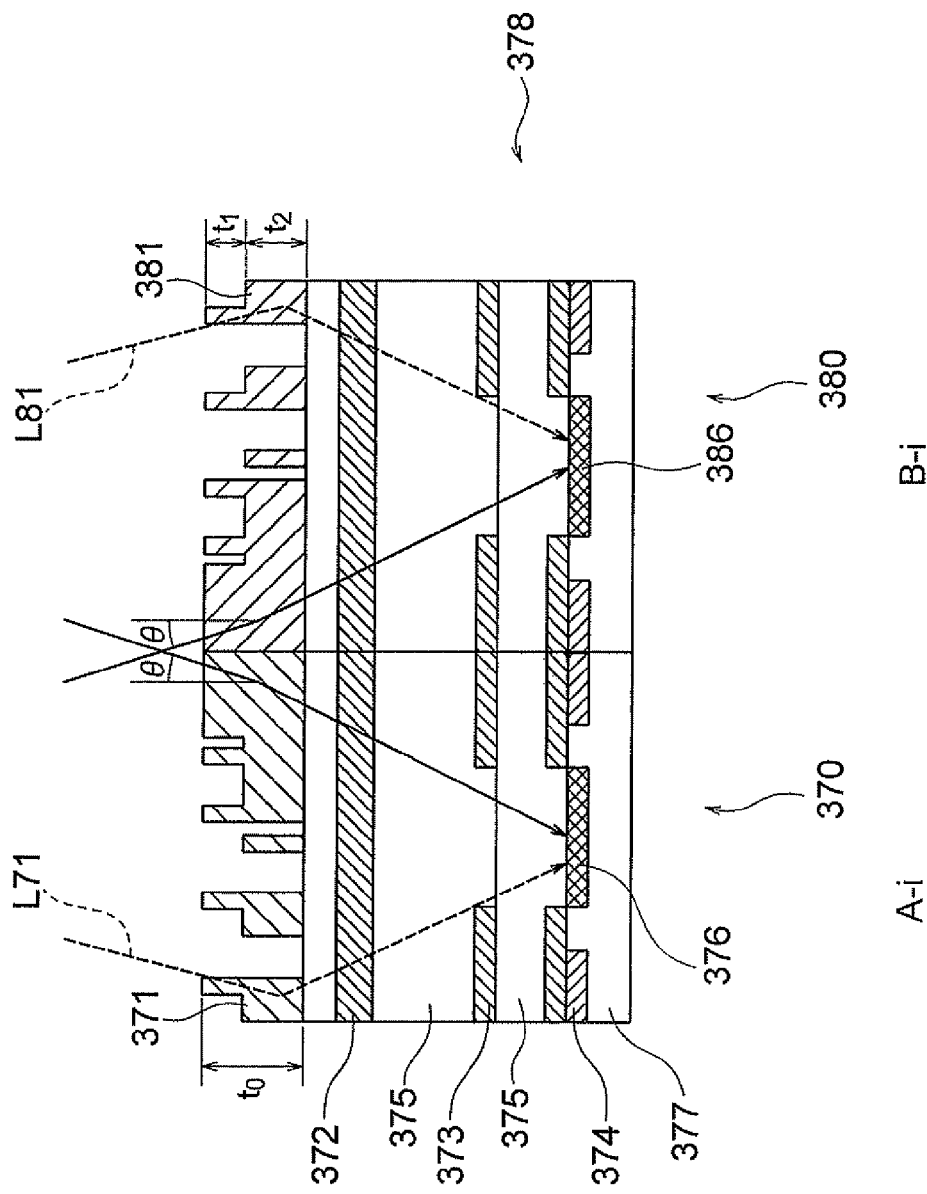
FIG. 15 is a cross-sectional view showing an internal structure of an image pickup element according to a sixth modified embodiment of the embodiment of the present invention.

Moreover, for pixels of the image pickup element, a pupil area which receives light by an arrangement of a light shielding member may be shifted as shown in FIG. 10 and FIG. 11, or FIG. 12 and FIG. 13. The pupil area which receives light by an arrangement of an on-chip lens may be shifted as shown in FIG. 14 and FIG. 15.

Figure 10:
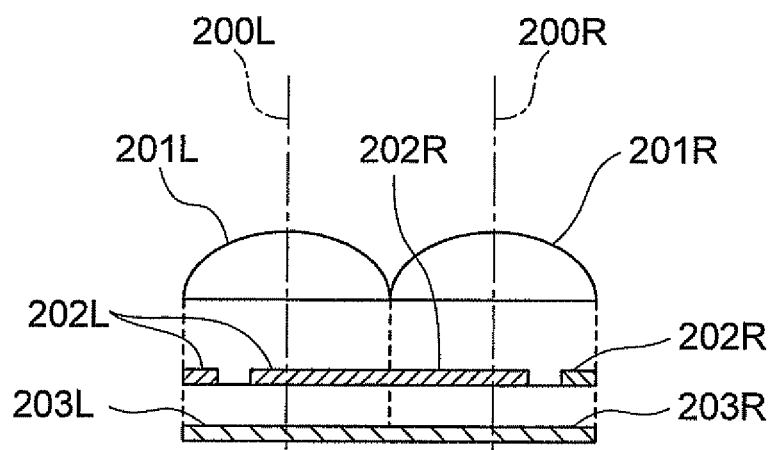
FIG. 10 is a cross-sectional view showing a schematic structure of pixels according to a third modified embodiment of the embodiment of the present invention.
Figure 11:
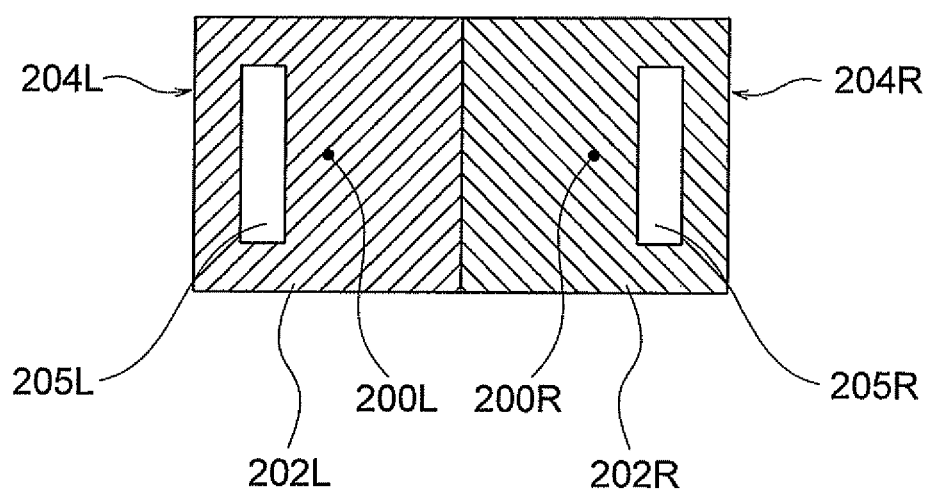
FIG. 11 is a diagram when the pixels shown in FIG. 10 are seen from a direction of optical axes 200L and 200R.

FIG. 10 is a cross-sectional view showing a schematic structure of pixels according to a third modified embodiment of the embodiment of the present invention. FIG. 11 is a diagram when the pixels shown in FIG. 10 are seen from a direction of optical axes 200L and 200R.

In FIG. 10 and FIG. 11, adjacent pixels are shown, and an area of photoelectric conversion areas 205L and 205R is same. However, a distance between positions of centers of gravity of area of the photoelectric conversion areas 205L and 205R and a distance of pixel pitch differ, which is similar as in the example shown in FIG. 3 and FIG. 4.

In FIG. 10 and FIG. 11, micro lenses 201L and 201R are disposed to correspond with pixels 204L and 204R respectively of a sensor. A distance between the micro lenses 201L and 201R is according to the pixel pitch. However, taking into consideration an output pupil position of a taking lens, the micro lenses 201L and 201R may be disposed at a distance shorter than the pixel pitch from a center toward a periphery.

Photoelectric conversion cells of the pixels 204L and 204R have photoelectric conversion surfaces 203L and 203R respectively. A light shielding member 202L is disposed between the micro lens 201L and the photoelectric conversion surface 203L, and a light shielding member 202R is disposed between the micro lens 201R and the photoelectric conversion surface 203R. A planar shape of the light shielding members 202L and 202R, as shown in FIG. 11, is bilaterally asymmetric with respect to the pixel center.

In FIG. 10 which shows the schematic structure, the light shielding members 202L and 202R are formed on the same plane. However, the light shielding members 202L and 202R may not be formed on the same plane in the same pixel.

The photoelectric conversion areas 205L and 205R of the respective pixels are determined by a relationship of the photoelectric conversion surfaces 203L and 203R, the light shielding members 202L and 202R, the micro lenses 201L and 201R, and a taking lens that is to be assumed. The photoelectric conversion areas 205L and 205R shown in FIG. 11, corresponds to openings formed by the light shielding members 202L and 202R on the photoelectric conversion surfaces 203L and 203R.

The micro lenses 201L and 201R are disposed such that optical axes 200L and 200R thereof pass through pixel centers of the corresponding pixels.

The pixels 204L and 204R, when seen from the optical axes 200L and 200R, have the same rectangular shape, and the pixel pitch is same as a size of the pixel. The pixel centers of the pixels 204L and 204R are points of intersection of diagonals of the rectangular planar shape.

By letting the planar shape of the light shielding members 202L and 202R to be bilaterally asymmetric, the pixel centers of the pixels, and the centers of gravity of area of the photoelectric conversion area are shifted in a left-right direction (left-right direction in FIG. 10 and FIG. 11). In other words, by the planar shape of the light shielding members 202L and 202R, a pupil area which receives light has been shifted.

FIG. 12 is a cross-sectional view showing a schematic structure of pixels according to a fourth modified embodiment of the embodiment of the present invention. FIG. 13 is a plan view when the pixels shown in FIG. 12 are seen from a direction of optical axes 300L, 300R, 310L, and 310R.

In FIG. 12 and FIG. 13, adjacent pixels are shown, and an area of photoelectric conversion areas 305L, 305R, 315L, and 315R is same. However, distances ds-n and ds-w between positions of centers of gravity (distances between centers of gravity of area) and a distance dp of pixel pitch differ.

Here, it is preferable that an area of the photoelectric conversion areas 305L, 305R, 315L, and 315R is substantially same. When the area is substantially same, it is preferable that the following conditional expression (7) is satisfied.

$$0.9 < SA/LA \leq 1 \tag{7}$$

where,

LA denotes an area of the largest photoelectric conversion area of a photoelectric conversion cell having a light-receiving spectral sensitivity A, from a photoelectric conversion cell group which forms a pixel group, and SA denotes an area of the smallest photoelectric conversion area of a photoelectric conversion cell having the light-receiving spectral sensitivity A, from the photoelectric conversion cell group which forms the pixel group.

In FIG. 12 and FIG. 13, micro lenses 301L, 301R, 311L, and 311R are disposed to correspond with pixels 304A, 304R, 314L, and 314R respectively of a sensor. A distance between the micro lenses 301L, 301R, 311L, and 311R is according to the pixel pitch. However, taking into consideration an output pupil position of a taking lens, the micro lenses 301L, 301R, 311L, and 311R may be disposed at a distance shorter than the pixel pitch from a center toward a periphery.

Photoelectric conversion cells of the pixels 304L, 304R, 314L, and 314R have photoelectric conversion surfaces 303L, 303R, 313L, and 313R respectively. In the respective pixels, light shielding members 302L and 302ML are disposed between the micro lens 301L and the photoelectric conversion surface 303L, light shielding members 302R and 303MR are disposed between the micro lens 301R and the photoelectric conversion surface 303R, light shielding members 312L and 312ML are disposed between the micro lens 311L and the photoelectric conversion surface 313L, and light shielding members 312R and 312MR are disposed between the micro lens 311R and the photoelectric conversion surface 313R.

The light shielding members 302L, 302R, 312L, and 312R are disposed to be along four sides of photoelectric conversion surfaces 303L, 303R, 313L, and 313R having a rectangular shape in a plan view. A planar shape of the light shielding members 302L, 302R, 312L, and 312R, as shown in FIG. 13, is bilaterally symmetric and vertically symmetric rectangular frame shape with a uniform width.

The light shielding members 302ML, 302MR, 312ML, and 312MR are disposed to divide an interior portion of the light shielding members 302L, 302R, 312L, and 312R bilaterally asymmetrically.

In FIG. 12 showing the schematic structure, the light shielding members 302L, 302ML, 302R, 302MR, 312L, 312ML, 312R, and 312MR are formed on the same plane. However, the light shielding members 302L, 302ML, 302R, 302MR, 312L, 312ML, 312R, and 312MR may not be formed on the same plane in the same pixel.

The photoelectric conversion areas 305L, 305R, 315L, and 315R of the respective pixels are determined by a relationship of the photoelectric conversion surfaces 303L, 303R, 313L, and 313R, the light shieldingmembers 302L, 302ML, 302R, 302MR, 312L, 312ML, 312R, and 312MR, the micro lenses 301L, 301R, 311L, and 311R, and a taking lens that is to be assumed. The photoelectric conversion areas 305L, 305R, 315L, and 315R shown in FIG. 13, correspond to openings formed by the light shielding members 302L, 302ML, 302R, 302MR, 312L, 312ML, 312R, and 312MR on the photoelectric conversion surfaces 303L, 303R, 313L, and 313R.

The micro lenses 301L, 301R, 311L, and 311R are disposed such that optical axes 300L, 300R, 310L, and 310R thereof pass through pixel centers 307L, 307R, 317L, and 317R respectively of the corresponding pixels.

The pixels 304L, 304R, 314L, and 314R, when seen from the optical axes 300L, 300R, 310L, and 310R, have the same rectangular shape, and the pixel pitch is same as a size of the pixel. The pixel centers 307L, 307R, 317L, and 317R of the pixels 304L, 304R, 314L, and 314R are points of intersections of diagonals of the rectangular planar shape (FIG. 13).

In the fourth modified embodiment, areas surrounded by the light shielding members 302L, 302R, 312L, and 312R are divided bilaterally asymmetrically by the light shielding members 302ML, 302MR, 312ML, and 312MR. Therefore, centers of gravity of area of the photoelectric conversion areas 305L, 305R, 315L, and 315 which are determined by these light shielding members assume positions which are shifted from the pixel centers 307L, 307R, 317L, and 317R of the respective pixels. Consequently, an arrangement is made such that, a pixel pitch dp which is same as a distance between the pixel centers 307L, 307R, 317L, and 317R of the adjacent pixels, and distances ds-n and ds-w between the centers of gravity of area which are distances between the centers of gravity 306L, 306R, 316L, and 316R of area of the adjacent photoelectric conversion areas differ.

FIG. 14 is a cross-sectional view showing a schematic structure of pixels according to a fifth modified embodiment of the embodiment of the present invention.

In an image pickup element in FIG. 14, on-chip lenses 361, 362, 363, and 364 on respective pixels are formed separately.

In FIG. 14, optical axes 361a and 363a of the on-chip lenses 361 and 363 of pixels of a pixel set A are shifted toward a left side from centers of the pixels. Moreover, optical axes 362a and 364a of the on-chip lenses 362 and 364 of pixels of a pixel set B are shifted toward a right side from centers of the pixels. By comparing outputs from the two pixel sets A and B, it is possible to calculate a focus amount of the lens.

In the on-chip lenses 361, 362, 263, and 364, it is possible to control independently two parameters namely, a refractive power and a shape such as a position of the optical axes 361a, 362a, 363a, and 364a. When the number of pixels is sufficiently large, the pixel set A and the pixel set B can acquire similar intensity distribution of light, and it is possible to carry out the phase-difference AF by using this. At this time, since it is possible to detect the amount of defocus on the overall screen, it is possible to acquire three-dimensional information of an object.

In an example shown in FIG. 14, the on-chip lenses are let to be decentered with respect to the centers of the pixels. Therefore, light rays L61 and L62 are incident on the on-chip lenses 361 and 362 respectively, and accordingly, an exit pupil is divided.

FIG. 15 is a cross-sectional view showing an internal structure of an image pickup element according to a sixth modified embodiment of the embodiment of the present invention.

In the image pickup element shown in FIG. 15, an on-chip lens is formed by a distributed refractive index lens. A pixel 370 and a pixel 380 are adjacent pixels which receive light beam from different areas.

In FIG. 15, the image pickup element includes distributed refractive index lenses 371 and 381 as DML (digital micro lenses), a color filter 372, an aluminum wire 373, a signal transmission portion 374, a flattening layer 375, light receiving elements 376 and 386 (such as an Si photodiode), and an Si substrate 377. As shown in FIG. 15, the aluminum wire 373, the signal transmission portion 374, the flattening layer 375, the light receiving elements 376 and 386, and the Si substrate 377 form a semiconductor integrated circuit. Here, a structure of the pixel 370 and a structure of the pixel 380 are similar except for the distributed refractive index lenses 371 and 381.

FIG. 15 shows light beams which are incident on the light receiving elements 376 and 386 respectively, from among all the light beams that are incident. By using the distributed refractive index lenses 371 and 381, light beams L71 and L81 are incident on the light receiving element 376 of the pixel 370 and the light receiving element 386 of the pixel 380 respectively, and an exit pupil is divided.

Figure 16:
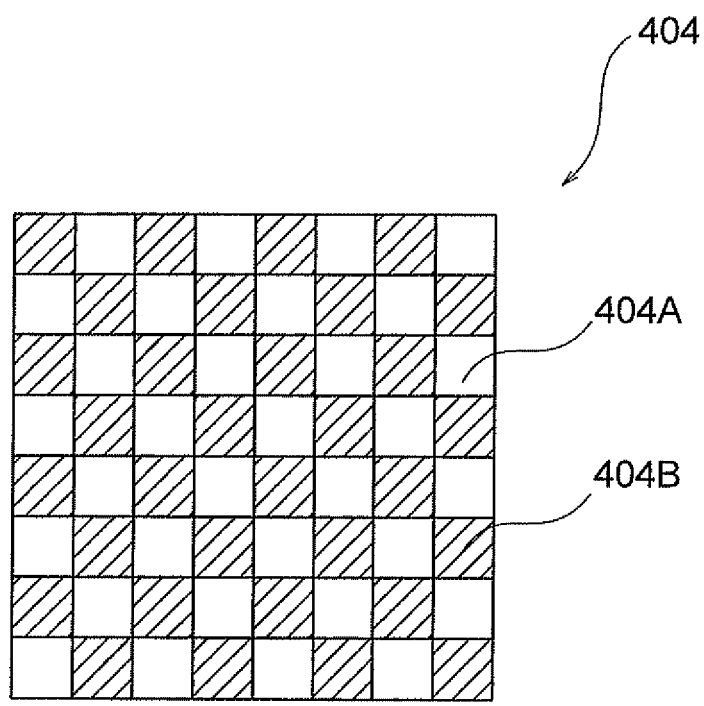
FIG. 16 is a plan view showing to be overlapped, an arrangement of a polarizing filter and a pixel arrangement in an imager according to a seventh modified embodiment of the embodiment of the present invention.

FIG. 16 is a plan view showing to be overlapped, an arrangement of a polarizing filter and a pixel arrangement in an imager according to a seventh modified embodiment of the embodiment of the present invention.

In a polarizing filter 404 shown in FIG. 16, transparent areas 404A and light shielding areas 404B are disposed in a checkered pattern upon associating with pixels in eight rows and eight columns. By using the polarizing filter 404 having such arrangement, it is possible to shift a pupil area.

Figure 17:
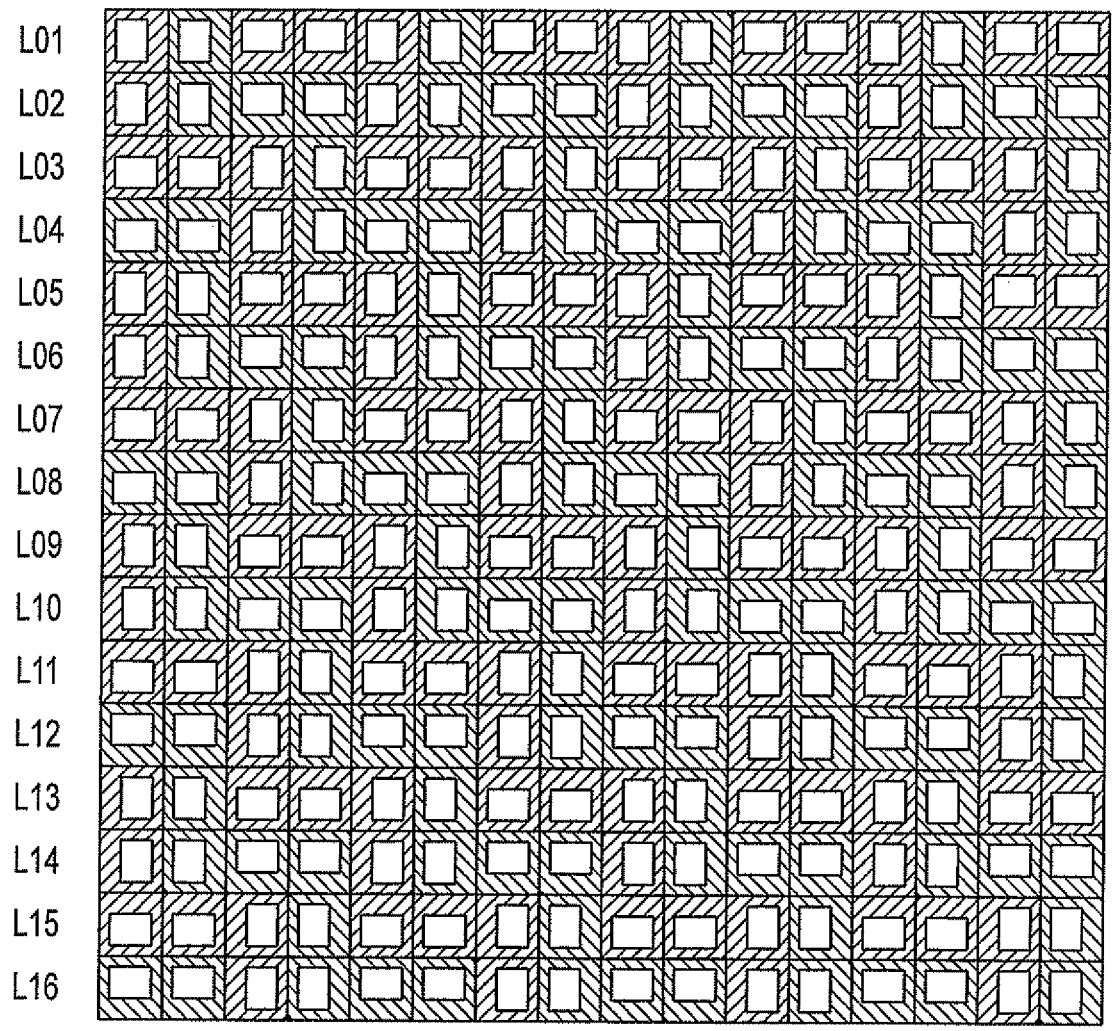
FIG. 17 is a plan view showing conceptually a pixel arrangement in an imager according to an eighth modified embodiment of the embodiment of the present invention.
Figure 17:
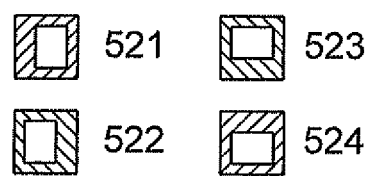

FIG. 17 is a plan view showing conceptually a pixel arrangement in an imager according to an eighth modified embodiment of the embodiment of the present invention. FIG. 18 is a plan view showing conceptually an arrangement of color filters upon associating with FIG. 17.

The pixel arrangement shown in FIG. 17 is an arrangement in which, four types of pixels namely, a right pixel 521, a left pixel 522, an upper pixel 523, and a lower pixel 524 are combined, and the pixels of the same type are arranged after every two adjacent rows and two adjacent columns. For example, pixels in two adjacent rows and two adjacent columns of L01 F01, L01 F02, L02 F01, and L02 F02 are all left pixels 522, and pixels in two adjacent rows and two adjacent columns of L01 F03, L01 F04, L02 F03, and L02 F04 are all upper pixels 523.

In the arrangement of the color filters in FIG. 18, pixel L01 F01 is let to be a filter G of green color, pixel L01 F02 is let to be a filter R of red color, pixel L02 F01 is let to be a filter B of blue color, and pixel L02 F02 is let to be the filter G of green color, and here onward, this combination pattern is repeated in a horizontal direction and a vertical direction. In this combination pattern, filters are disposed corresponding to pixels of two adjacent rows and two adjacent columns, in which, same type of pixels are disposed in FIG. 17. By associating the pixel arrangement in FIG. 17 and the arrangement of the color filters in FIG. 18, it is possible to carry out highly accurate focus detection irrespective of a color of object. However, a combination of a direction of shifting of the photoelectric conversion area from the pixel center, and the color filters is not required to be restricted to the abovementioned combination.

Moreover, in FIG. 17 and FIG. 18, for ranging, when the left pixel 522 and the right pixel 521, or the upper pixel 523 and the lower pixel 524 are selected, distance between the centers of gravity differs from a distance which is to be calculated from the pixel pitch. In FIG. 18, the filters G, R, B, and G of two adjacent rows and two adjacent columns being disposed repeatedly, it is possible to select filters of the same color at the time of selecting two pixels for ranging. For example, for pixel L06 F01 (the left pixel 522) and pixel L04 F03 (the right pixel 521) it's the same filter B of blue color, and the distance between the centers of gravity of the photoelectric conversion areas becomes longer than the distance which is calculated from the pixel pitch. Moreover, for pixel L03 F03 and pixel L05 F05, it's the same filter G of green color, and the distance between the centers of gravity of the photoelectric conversion areas becomes shorter than the distance which is calculated from the pixel pitch.

Figure 19:
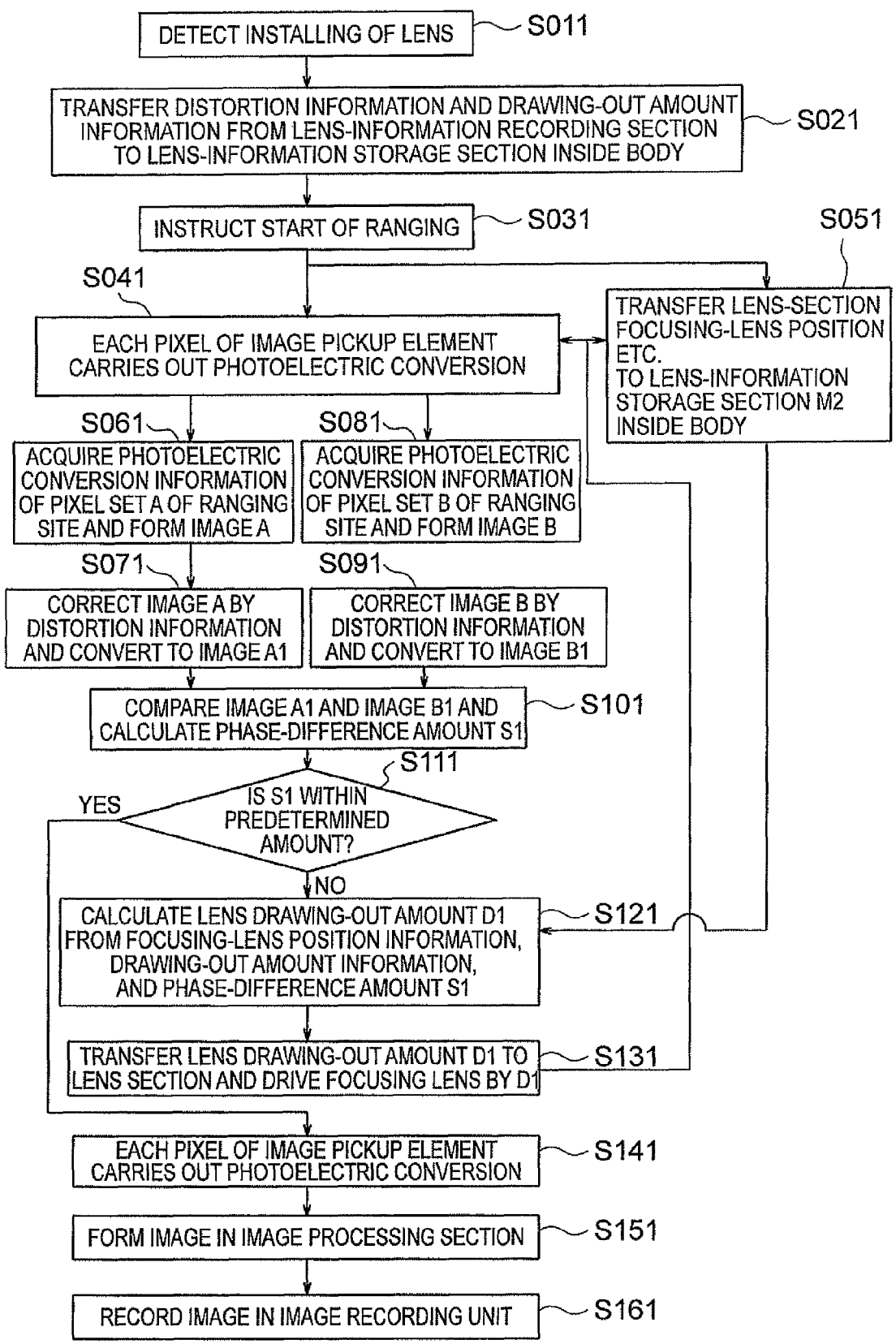
FIG. 19 is a flowchart showing a flow of a process of the image pickup system according to the embodiment of the present invention.
Figure 20:
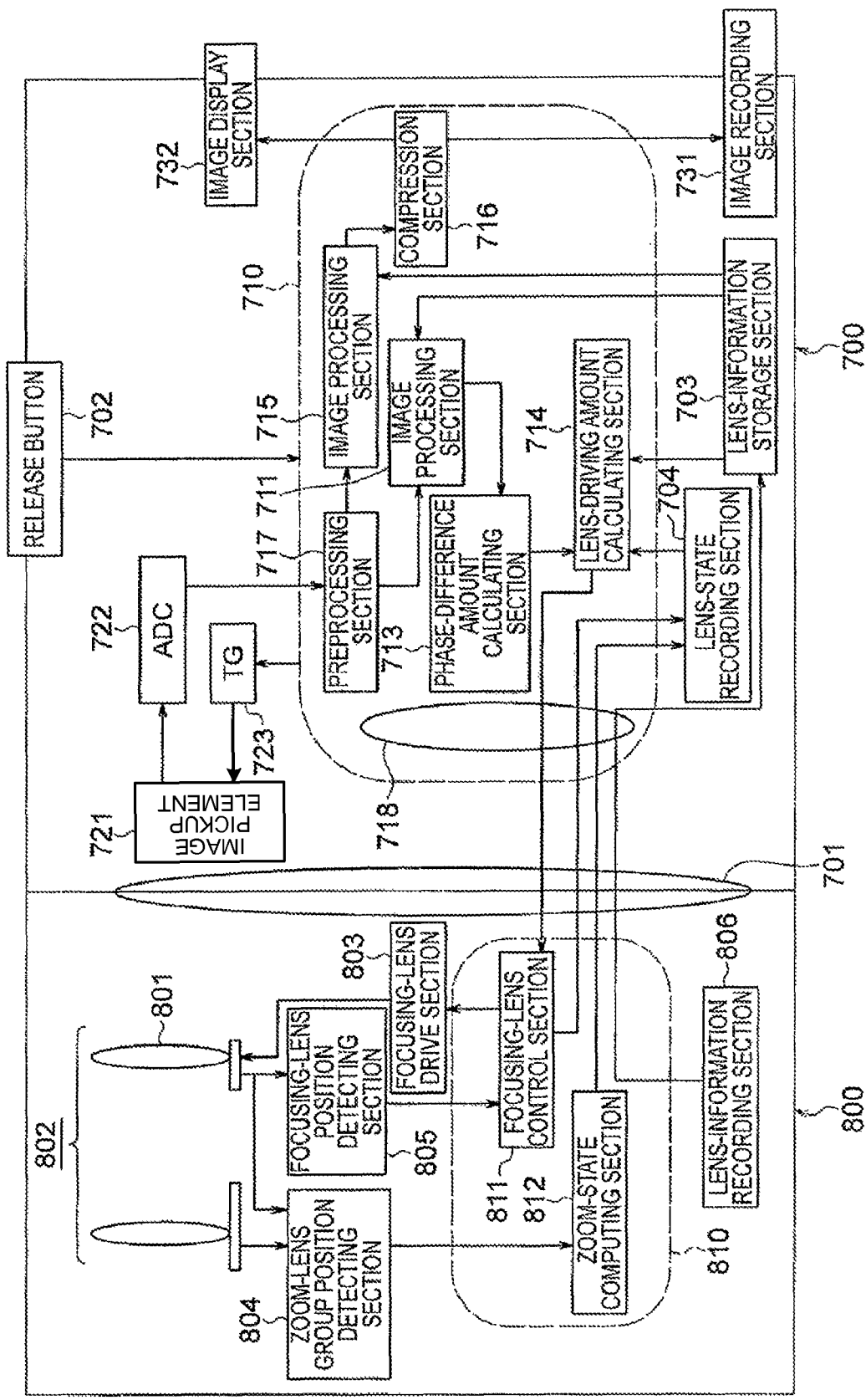
FIG. 20 is a block diagram showing in further detail, a structure of a camera system (an image pickup system) of an interchangeable lens type according to the embodiment of the present invention.

Distortion information, in a camera system shown in FIG. 20 for example, can be acquired by a flow of a process shown in FIG. 19. FIG. 19 is a flowchart showing a flow of a process of the image pickup system according to the embodiment of the present invention. FIG. 20 is a block diagram showing in further detail, a structure of a camera system (an image pickup system) of an interchangeable lens type according to the embodiment of the present invention.

In this case, distortion information for correcting a recorded image (any of a still image and a video image) and distortion information for the phase-difference AF may be held in common. By making such an arrangement, it is possible to carry out focus detection with high accuracy by a taking lens having only distortion information for the recorded image. Moreover, when the correction is carried out by the same operation, it is possible to reduce a load of processing.

Moreover, by information which is held commonly with the distortion information for the recorded image, an operation different from distortion for the recorded image may be carried out. For instance, correction of a waveform of the phase difference AF may be carried out. Such correction of a waveform is not required to be carried out by distortion correction for the recorded image.

Furthermore, distortion-correction information independent of the distortion information for recorded image may be held. Accordingly, correction of the waveform of the phase-difference AF can be carried out efficiently. Moreover, sometimes a correction effect of the distortion correction for the recorded image is to be weakened taking into consideration a fish-eye lens effect and a perspective effect. When the information is independent information, with accurate focusing, it is possible to achieve a favorable recorded image having a natural distortion of an image. In a case of taking the perspective effect into consideration, it is desirable to make a correction amount for the recorded image to be smaller than a correction amount for the AF.

Moreover, when the distortion information cannot be acquired from the interchangeable lens, in other words, there is also a way of correcting upon setting an average correction amount. However, a process may be let to be such that correction is not carried out, letting the distortion of a taking lens to be small. In other words, a lens for which the distortion has been corrected sufficiently is to be assumed. In this regard, it is desirable to take into consideration a fact that for an interchangeable lens for the conventional single-lens reflex camera, the distortion has been corrected sufficiently. Moreover, a separate correction value may be input. Furthermore, a mode in which, a correction amount of a signal for detecting a defocus signal and a correction value of image data to be recorded are different, may be provided.

It is preferable to impart a database inside a body, and make an arrangement such that appropriate distortion information can be used upon distinguishing lens.

In a case of a fixed taking lens and not an interchangeable taking lens, it is preferable to impart information inside the body in advance.

Regarding a method of correction, signals of two images may be compared, and correction may be carried out after the phase-difference information has been acquired.

A flow of a process when a camera system of an interchangeable lens type is used as an image pickup system according to the embodiment of the present invention will be described below.

Firstly, in a camera system of the interchangeable lens type shown in FIG. 20, when a interchangeable lens 800 is installed on a body mounting/lens mounting coupling portion 701 of a camera body (camera main body) 700, installing of the interchangeable lens 800 is detected at the camera body 700 side (step S011).

Next, drawing-out amount information and distortion information which have been stored in a lens-information recording section 806 inside the interchangeable lens 800 are transferred to and recorded in a lens-information storage section 703 inside the camera body 700 (step S021). At this time, in a case in which, there is no distortion data in the lens-information recording section 806, the amount of distortion may be recorded as 0 in the lens-information storage section 703.

By a release button (shutter button) 702 being half-pressed by a user, a signal to instruct start of ranging is output to a camera controller 710 (step S031). At this time, a process of setting a ranging site may be introduced. Setting of the ranging site may be carried out manually by the user, or may be carried out according to a rule which has been set in advance in the camera.

By step S031, each pixel of an image pickup element 721 carries out photoelectric conversion (step S041). At this time, pixels which carry out photoelectric conversion selectively according to the requirement may be set.

A signal which is subjected to photoelectric conversion is converted to a digital signal by an ADC (analog-to-digital converter) 711, and is output to a preprocessing section 717. The signal output to the preprocessing section 717 is subjected to a process of conversion to a format which is suitable for processing in image processing sections 715 and 711. Moreover, the image pickup element 721 operates according to an output from a TG (timing generator) which has been controlled by the camera controller 710.

By step 031, focusing-lens position information which has been stored in a zoom-state computing section 812 of the interchangeable lens 800 is transferred to and recorded in a lens-state recording section 704 inside the camera body 700 (step S051). Here, when the interchangeable lens 800 is a zoom lens, information of a state of a focal length in addition to the focusing-lens position information may also be transferred. The focusing-lens position information is information which has been computed by a predetermined method by the zoom-state computing section 812, based on position information of a taking lens system 802 including a focusing lens 801, which a zoom-lens group position detecting section 804 has detected.

By the photoelectric conversion carried out at step S041, the image processing section 711 acquires photoelectric conversion information of a first pixel set A of a ranging site, and forms an image A (step S061).

Furthermore, the image processing section 711 (correction section) converts the image A which has been formed, to an image A1 (step S071) by correcting by using the distortion information which has been acquired at step S021.

Moreover, by the photoelectric conversion which has been carried out at step S041, the image processing section 711 acquires photoelectric conversion information of a second pixel set B of a ranging site, and forms an image B (step S081).

Here, the first pixel set A forms one photoelectric conversion cell group, and the second pixel set B forms another photoelectric conversion cell group.

Furthermore, the image processing section 711 converts the image B which has been formed, to an image B1 (step S091) by correcting by using the distortion information which has been acquired at step S021.

A phase-difference amount calculating section 713 compares the image A1 and the image B1, and calculates a phase-difference amount S1 which calculates the amount of defocus (step S101).

A lens-driving amount calculating section 714, when the phase-difference amount S1 calculated at step S101 is within a predetermined amount, makes a judgment as a focused state, and when the phase difference amount S1 calculated at step S101 is beyond the predetermined amount, makes a judgment as a not-focused state (step S111). Here, the predetermined amount may be set from a depth of field which is calculated from a minimum diameter of circle of confusion, or information from the taking lens may be referred to.

When a judgment that the phase-difference amount S1 has crossed the predetermined amount (NO at step S111), the lens driving amount calculating section 714 calculates a lens drawing-out amount D1 (step S121) from the phase-difference information S1, the drawing-out amount information which has been recorded in the lens-information storage section 703, and information such as focusing-lens position which has been recorded in the lens-state recording section 704. As a method for calculating the drawing-out amount D1, a method same as the conventional phase-difference AF can be used. The drawing-out amount may be an amount in a direction of drawing out, or may be a control value such as a drive pulse of a focusing-lens drive section 803 (motor) which drives the focusing lens 801.

The camera controller 710 transfers the information of the drawing-out amount D1 which has been calculated at step S121 to a lens controller 810 of the interchangeable lens 800. Based on the drawing-out amount D1 which has been transferred, the a focusing-lens control section 811 makes the focusing-lens drive section 803 drive the focusing lens 801 only by the drawing-out amount D1 (step S131). At this time, the focusing-lens control section 811 controls the focusing-lens drive section 803 based on position information of the focusing lens 801 which a focusing-lens position detecting section 805 has detected. Communication between the camera controller 710 and the lens controller 810 is controlled by a communication control section 718 inside the camera controller 710.

After driving the focusing lens 801 at step S131, the process returns to steps S041 and s051, and the camera controller 710 checks whether the focused state is assumed or not.

Whereas, when at step S111 the lens-driving amount calculating section 714 has made a judgment that the phase-difference amount S1 is within the predetermined amount (YES at step S111), the photoelectric conversion is carried out for each pixel of the image pickup element 721 (step S141). The image processing section 715 carries out image formation (step S151) based on a signal which has been subjected to photoelectric conversion. In other words, the image processing section 715 generates a photographic image. The image which has been formed is compressed to a predetermined format in a compression section 716, and is recorded in an image recording section 731 (image recording unit) (step S161). Moreover, the image which has been compressed is displayed on an image display section 732.

At step S151, apart from the image formation, image processing which is suitable for the overall image may be carried out by information which has been recorded in the lens-information storage section 703.

The image recording section 731 may be a memory provided inside the camera body 700, or may be an external memory which is installed on the camera body 700.

As it has been described above, in FIG. 19, an arrangement is made such that after step S131, the process returns to step S041 and step S051, and at a point of time where the phase-difference amount S1 becomes less than the predetermined amount (YES at step S111), the process advances to step S141. Whereas, in a case in which, an AF speed is to be given priority, an arrangement may be made such that, after step S131, the process advances directly to step S141 without returning to step S041 and step S051. Moreover, even in a case in which, after step S131, the process returns to step S041 and step S051, an arrangement may be made such that, when the judgment at step S111 is made for more than the stipulated number of times, the process advances to step S141, and a photographic image is acquired assuredly.

Figure 21:
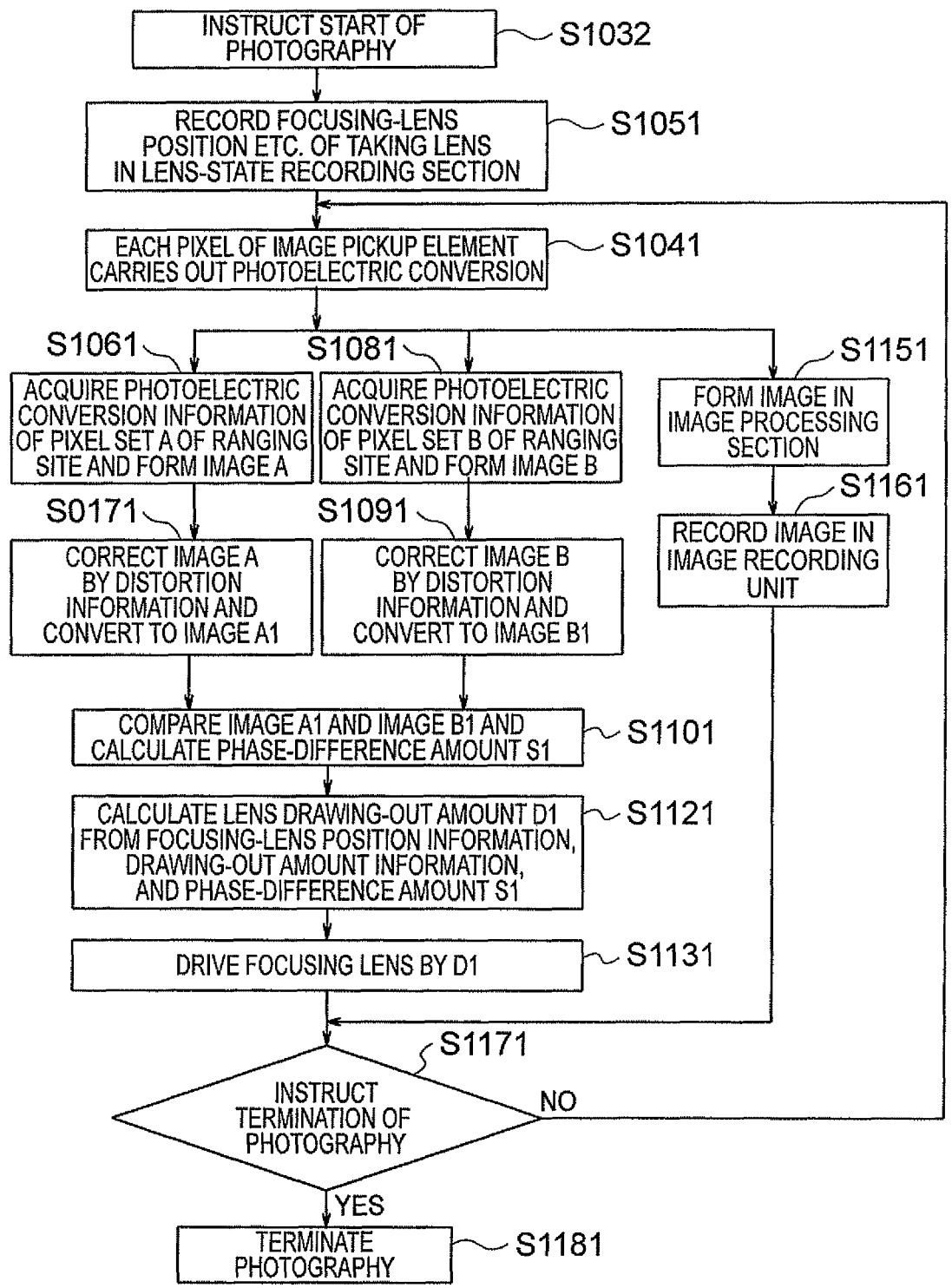
FIG. 21 is a flowchart showing a flow of a process of the image pickup system according to the embodiment of the present invention.
Figure 22:
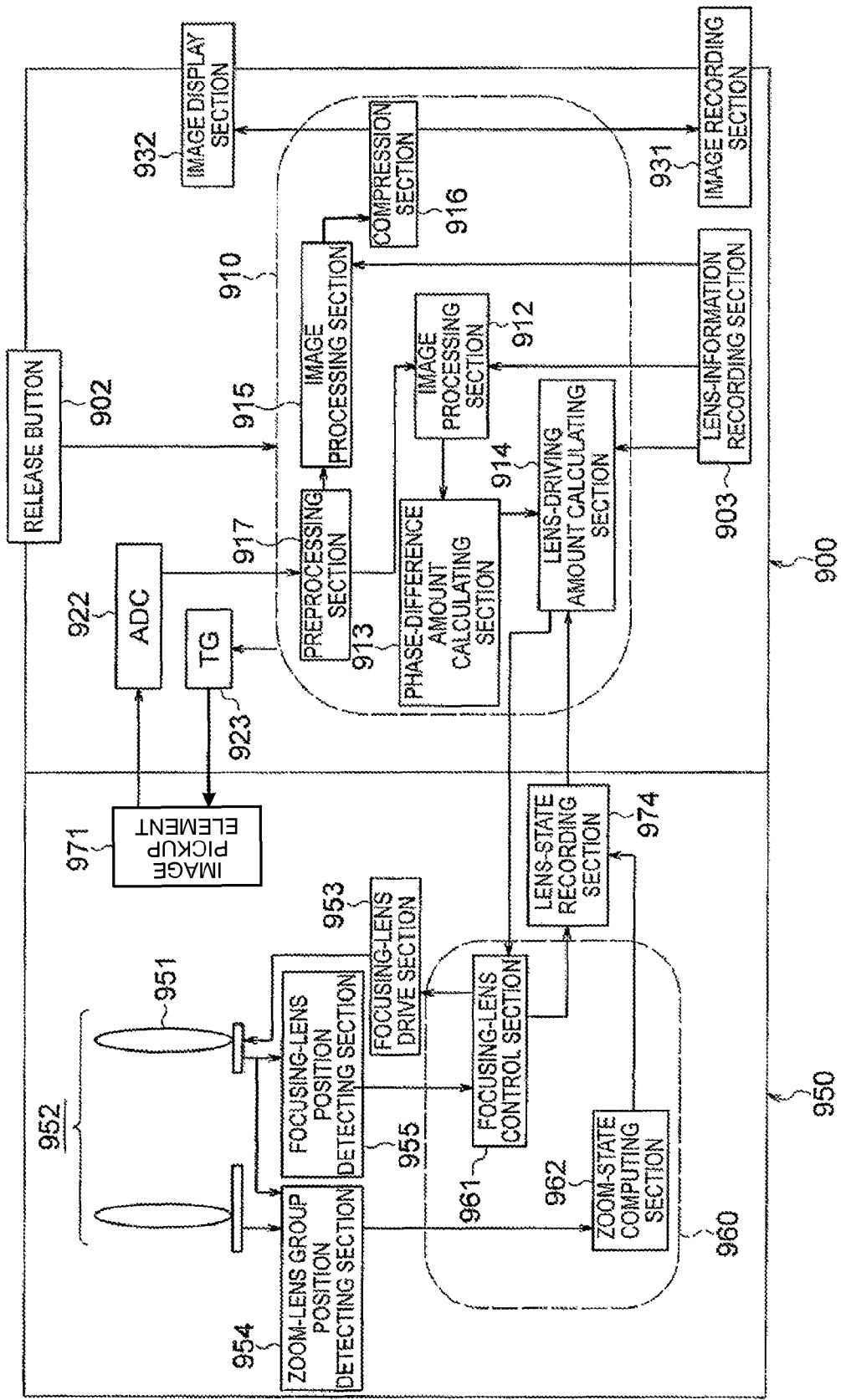
FIG. 22 is a block diagram showing in further detail, a structure of a camera (an image pickup system) of an integrated lens type.

Next, a flow of a process in a case in which, a camera of an integrated lens type is used as an image pickup system according to a first embodiment, will be described by referring to FIG. 21 and FIG. 22. FIG. 21 is a flowchart showing a flow of a process of the image pickup system. FIG. 22 is a block diagram showing in further detail, a structure of a camera (image pickup system) of an integrated lens type.

Firstly, before flow shown in FIG. 21 starts, data such as distortion information and drawing-out amount information are stored in a lens-information recording section 903 of a camera body 900.

In a case of capturing a video image for example, by an operation such as half-pressing of a release button 902 by a user, a signal to instruct start of ranging is output to a camera controller 910 (step S1031).

Next, focusing-lens position information of a taking lens is recorded in a lens-state recording section 974 (step S1051). In a case in which, the taking lens is a zoom lens, a state of a focal length may also be recorded in addition.

Next, each pixel of an image pickup element carries out photoelectric conversion (step S1041). A signal which is subjected to photoelectric conversion is converted to a digital signal by an ADC (analog-to-digital converter) 922, and is output to a preprocessor 917. The signal output to the preprocessor 919 is subjected to a process of conversion to a format which is suitable for processing in image processing sections 915 and 912. Moreover, an image pickup element 971 operates according to an output from a TG (timing generator) which is controlled by the camera controller 910.

Based on the photoelectric conversion carried out at step S1041, the image processing section 915 carries out image formation (step S1151). An image which is formed is compressed to a predetermined format by a compression section 916, and is recorded in an image recording section 931 (image recording unit) (step S1161). Moreover, the image which has been compressed is displayed on an image display section 932.

Here, the description has been made on the premise of video photography. However, steps shown in FIG. 21 are also applicable in a case of still photography.

By step S1031, focusing-lens position information which has been stored in a zoom-state computing section 962 of a lens section 950 is transferred to the lens-state recording section 974. Here, in a case in which, the lens section 950 is a zoom lens, information of a state of a focal length may also be transferred in addition to the focusing-lens position information. The focusing-lens position information is information which has been computed by a predetermined method by the zoom-state computing section 962, based on position information of a taking lens system 952 including a focusing lens 951, which the a zoom-lens group position detecting section 954 has detected.

On the other hand, by the photoelectric conversion carried out at step S1041, an image processing section 912 acquires photoelectric conversion information of a first pixel set A of a ranging site, and forms an image A (step S1061). At this time, setting of the ranging site may be carried out manually by the user, or may be carried out according to a rule which has been set in advance in the camera.

Furthermore, the image processing section 912 (correction section) converts image A which has been formed, to an image A1 by correcting by using the distortion information (step S1071).

Moreover, by the photoelectric conversion which has been carried out at step S1041, the image processing section 912 acquires photoelectric conversion information of a second pixel set B of a ranging site, and forms an image B (step S1081). Furthermore, the image processing section 912 converts the image B which has been formed, to an image B1 (step S1091) by correcting by using the distortion information.

Next, a phase-difference amount calculating section 913 compares the image A1 and the image B1, and calculates a phase-difference amount S1 from which, the amount of defocus is calculated (step S1101).

Next, a lens-driving amount calculating section 914 calculates a lens-driving amount D1 (step S1121) from the drawing-out amount information recorded in the lens-information recording section 903, and information such as a focusing-lens position recorded in the lens-state recording section 974. As a method for calculating the drawing-out amount D1, a method same as the conventional phase-difference AF can be used. The drawing-out amount may be an amount in a direction of drawing out, or may be a control value such as a drive pulse of a focusing-lens drive section 953 (motor) which drives the focusing lens 951. Moreover, in video photography, the driving amount may be determined upon taking into consideration a traveling speed.

The camera controller 910 transfers the information of the drawing-out amount D1 which has been calculated at step S1121 to a lens controller 960 of the lens section 950. Based on the drawing-out amount D1 which has been transferred, a focusing-lens control section 961 makes the focusing-lens drive section 953 drive the focusing lens 951 only by the drawing-out amount D1 (step S1131). At this time, the focusing-lens control section 961 controls the focusing-lens drive section 953 based on position information of the focusing lens 951 which a focusing-lens position detecting section 955 has detected.

After driving the focusing lens 951, when there is an instruction for terminating photography by an operation of a switch etc. on the camera body 900 (YES at step 1171), the photography ends (step S1181). When there is no instruction for terminating the photography (NO at step S1171), the process returns to step S1051, and process from recording of the focusing position onward is carried out.

Process from step S1041 up to step S1131 may be let to advance once in a cycle of steps from S1151 to S1161 carried out for a plurality of times.

Moreover, according to the conditions, a flow of a contrast AF may be added to this flow.

The rest of the action, effect, and modified embodiments are similar as in the case of the camera system of the interchangeable lens type.

As it has been described above, the image pickup system according to the present invention is useful for an image pickup system which is includes a taking lens system, on the premise of correcting by image processing.

The image pickup system according to the present invention shows an effect that it is possible to provide an AF system which selects phase-difference information from a signal from an image pickup element, which is capable of focusing favorably even for a taking lens system, on the premise of correcting by image processing.

What is claimed is:
1. An image pickup system comprising:
an image pickup apparatus in which, photoelectric conversion cells which convert an optical image which has been formed by a taking lens to an electric signal, are arranged two-dimensionally, wherein at least some of the photoelectric conversion cells are arranged to output a signal for detecting an amount of defocus, and the photoelectric conversion cells which output the signal for detecting the amount of defocus constitute at least two photoelectric conversion cell groups, each receiving a light beam from a pupil area having a different area, and each photoelectric conversion cell group has a plurality of photoelectric conversion cell columns, and the image pickup system further comprising:

a calculating section which has an auto focus (AF) mode which generates a defocus signal by comparing mutually the signals for detecting the amount of defocus, which have been output from the two photoelectric conversion cell groups; and a correction section which corrects the signal for detecting the amount of defocus, from information related to distortion of the taking lens, wherein the taking lens satisfies the following conditional expression:

$$0.05 \leq |(1 - Yim/(f \cdot \tan(\omega im)))| \leq 0.35$$

where f denotes a focal length of the taking lens,

Yim denotes an arbitrary image height in a range of 0.4 to 0.8 when a distance from a center in an effective image pickup surface of an electronic image pickup element up to the farthest point is let to be 1, and ωim denotes an angle with respect to an optical axis in an object-point direction corresponding to image points connecting from the center on the effective image pickup surface of the electronic image pickup element up to a position of Yim.

2. The image pickup system according to claim 1, wherein the correction section corrects signal information of one photoelectric conversion cell column of the photoelectric conversion cell group, and let the signal information which has been corrected, to be one set of signal information, and corrects signal information of the photoelectric conversion cell column of another photoelectric conversion cell group, and let the signal information which has been corrected, to be another set of signal information, and calculates phase-difference information from these two sets of signal information.

3. The image pickup system according to claim 1, wherein the correction section corrects a signal for detecting a defocus signal by information for correcting distortion of a recorded image of the taking lens stored in a lens-information recording section.

4. The image pickup system according to claim 1, wherein a correction amount of a signal for detecting the defocus signal and a correction value of image data which is recorded have different modes.

5. The image pickup system according to claim 1, wherein the taking lens is detachably attachable, and when information related to distortion of an image of the taking lens cannot be read in a predetermined format by the taking lens which has been installed, the correction of distortion is not to be carried out.

6. The image pickup system according to claim 1, wherein the correction of signal for detecting the defocus signal is to be carried out at a position where image height is more than 0.5.

* * * * *